United States Patent
Tam et al.

(10) Patent No.: US 10,069,018 B1
(45) Date of Patent: Sep. 4, 2018

(54) CAMERA ASSEMBLY WITH EMBEDDED COMPONENTS AND REDISTRIBUTION LAYER INTERCONNECTS

(71) Applicant: Amazon Technologies, Inc., Seattle, WA (US)

(72) Inventors: Samuel Waising Tam, Daly City, CA (US); Tak Shing Pang, Hong King (CN)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 31 days.

(21) Appl. No.: 15/169,236

(22) Filed: May 31, 2016

(51) Int. Cl.
*H01L 27/146* (2006.01)
*H01L 31/0203* (2014.01)
*H01L 31/0216* (2014.01)
*H01L 31/0224* (2006.01)
*H01L 31/02* (2006.01)
*H01L 31/0232* (2014.01)

(52) U.S. Cl.
CPC .. *H01L 31/02005* (2013.01); *H01L 27/14685* (2013.01); *H01L 31/0203* (2013.01); *H01L 31/02327* (2013.01)

(58) Field of Classification Search
CPC ........... H01L 31/0203; H01L 31/02005; H01L 27/14687; H01L 27/14634; H01L 27/14683; H01L 27/14618
See application file for complete search history.

(56) References Cited

U.S. PATENT DOCUMENTS

| | | | | |
|---|---|---|---|---|
| 2005/0161587 A1* | 7/2005 | Mihara | ................ | H01L 21/6835 250/214 R |
| 2008/0308928 A1* | 12/2008 | Chang | ................. | H01L 25/0657 257/723 |
| 2012/0105713 A1* | 5/2012 | Luan | .................... | H04N 5/2251 348/374 |
| 2016/0197113 A1* | 7/2016 | Wong | ................ | H01L 27/14636 257/432 |

OTHER PUBLICATIONS

Johnson et al., "3-D Packaging: A Technology Review" Available at: https://nepp.nasa.gov/files/16285/05_037a%20Johnson%203D%20Packaging%20Report%20071805.pdf, 70 pages, (Jun. 23, 2005).

* cited by examiner

*Primary Examiner* — Steven Loke
*Assistant Examiner* — Scott Stowe
(74) *Attorney, Agent, or Firm* — K&L Gates LLP

(57) ABSTRACT

Systems and methods of manufacturing compact camera assemblies for use in electronic device are provided. The camera assemblies include an image sensor and a camera component. The camera assemblies further include a molding compound transfer molded onto the image sensor and the camera component to form a camera component subassembly. A redistribution layer is formed on a surface of the camera component subassembly. The redistribution layer includes at least one dielectric layer and a first interconnect layer. The camera assemblies further include a lens module coupled to the redistribution layer and aligned with the image sensor along an optical axis.

23 Claims, 26 Drawing Sheets

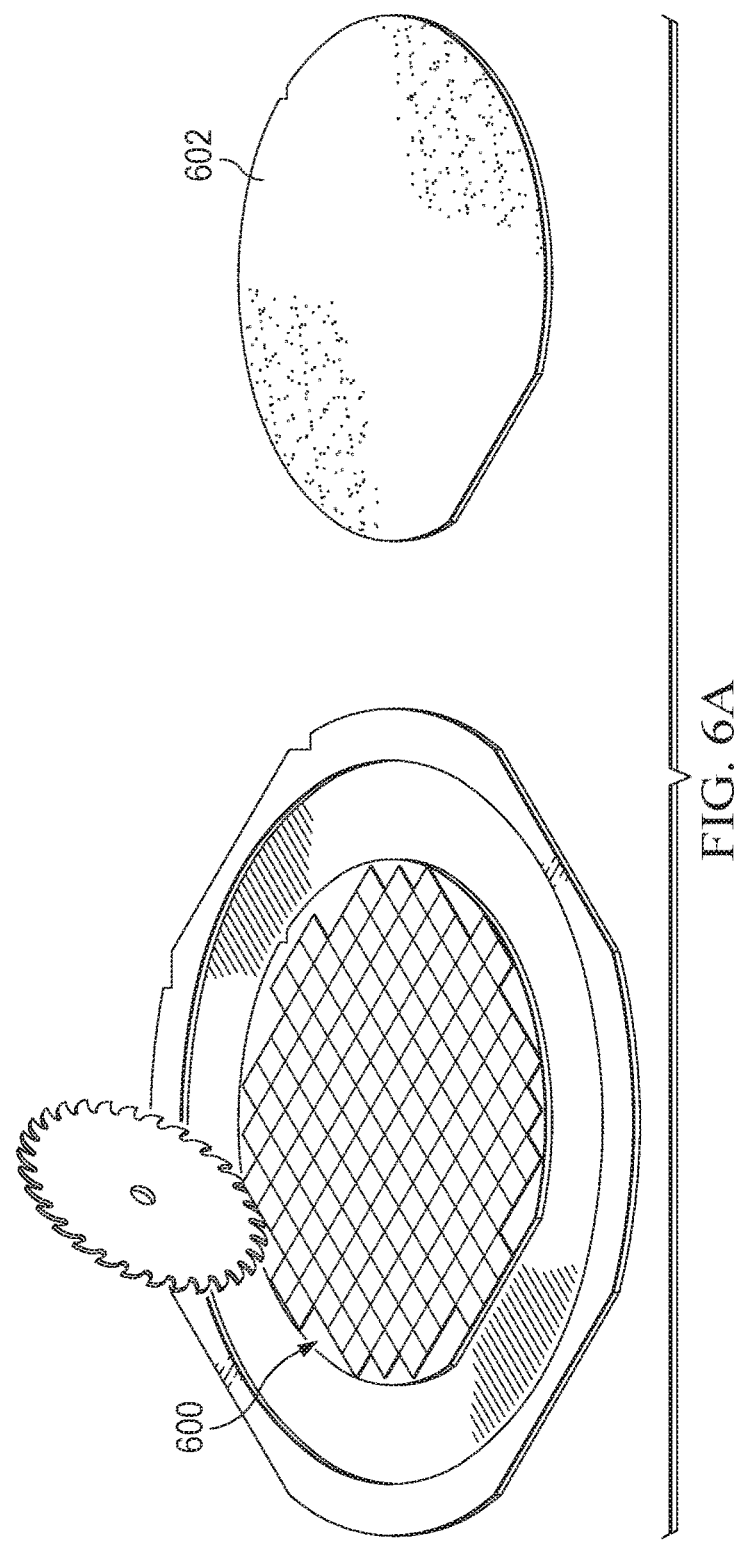

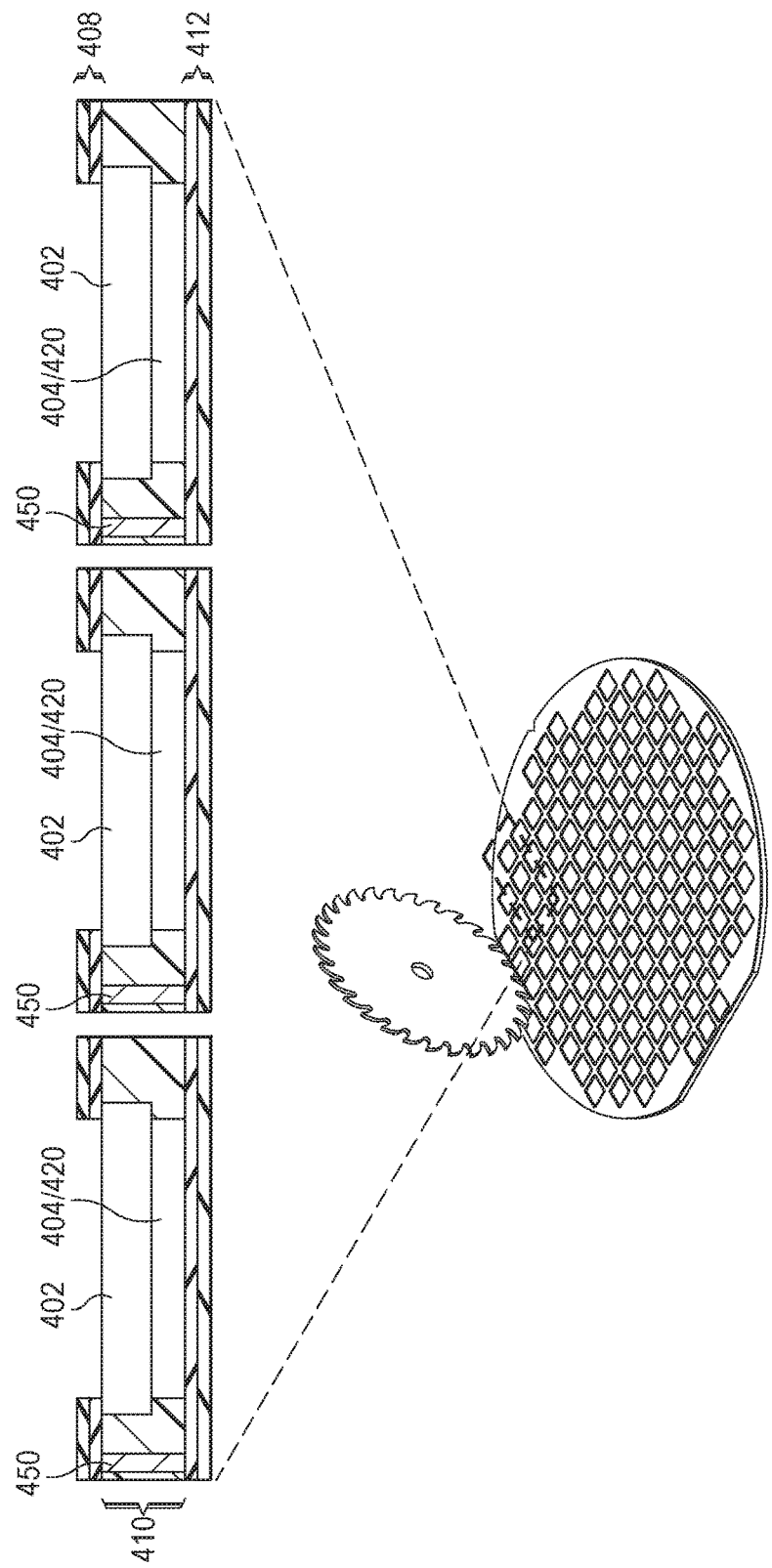

ns of the present invention. It is understood that other
CAMERA ASSEMBLY WITH EMBEDDED COMPONENTS AND REDISTRIBUTION LAYER INTERCONNECTS

BACKGROUND

Digital camera functionality is being incorporated into a wide variety of electronic devices. In particular, there is an increased demand by consumers for high quality photographic capability in consumer electronics and mobile computing devices, such as mobile phones, smartphones, and tablet computers. However, there is also high demand for mobile computing devices with increasingly small form factors, with extremely thin devices being particularly desirable for both aesthetics and portability. In addition, there is an ongoing desire to improve quality and functionality while decreasing the cost of components and manufacturing. For example, gold bonds, C4 bumps, and other types of interconnections between camera components can significantly contribute to per unit cost and can result in camera module form factor design constraints.

Accordingly, there is a need for improved camera module designs and manufacturing processes for incorporation into electronic devices.

BRIEF DESCRIPTION OF DRAWINGS

FIGS. 6A-6J illustrate various steps in the manufacturing process illustrated in FIG. 5.

DETAILED DESCRIPTION

In the following description, reference is made to the accompanying drawings which illustrate several embodiments of the present invention. It is understood that other embodiments may be utilized and mechanical, compositional, structural, electrical operational changes may be made without departing from the spirit and scope of the present disclosure. The following detailed description is not to be taken in a limiting sense, and the scope of the embodiments of the present invention is defined only by the claims of the issued patent.

Systems and methods in accordance with various embodiments of the present disclosure provide improved manufacturing methods and camera module designs that may be compact, inexpensive to manufacture, and reliable in operation. These designs may provide small form factor fixed focus or autofocus (AF) camera assemblies for incorporation into thin mobile devices, such as tablets or smartphones. In accordance with some embodiments, a camera assembly includes a lens module, an image sensor and a plurality of camera components. A molding compound may be transfer molded onto the image sensor and the plurality of camera components such that the image sensor and the plurality of camera components are at least partially embedded in the molding compound. The molding compound, together with the at least partially embedded image sensor and/or the at least partially embedded camera components may be referred to herein as a camera component subassembly. A redistribution layer may be formed on a side of the camera component subassembly. The redistribution layer may include at least one dielectric layer and at least one interconnect layer. The redistribution layer may electrically couple the image sensor and/or the camera components to one another and/or to one or more contact pads coupled to the redistribution layer. In some examples, at least one contact pad may be electrically coupled to the image sensor via at least one of the interconnect layers. The lens module may be coupled to the redistribution layer to form the camera assembly.

Figure 1A:
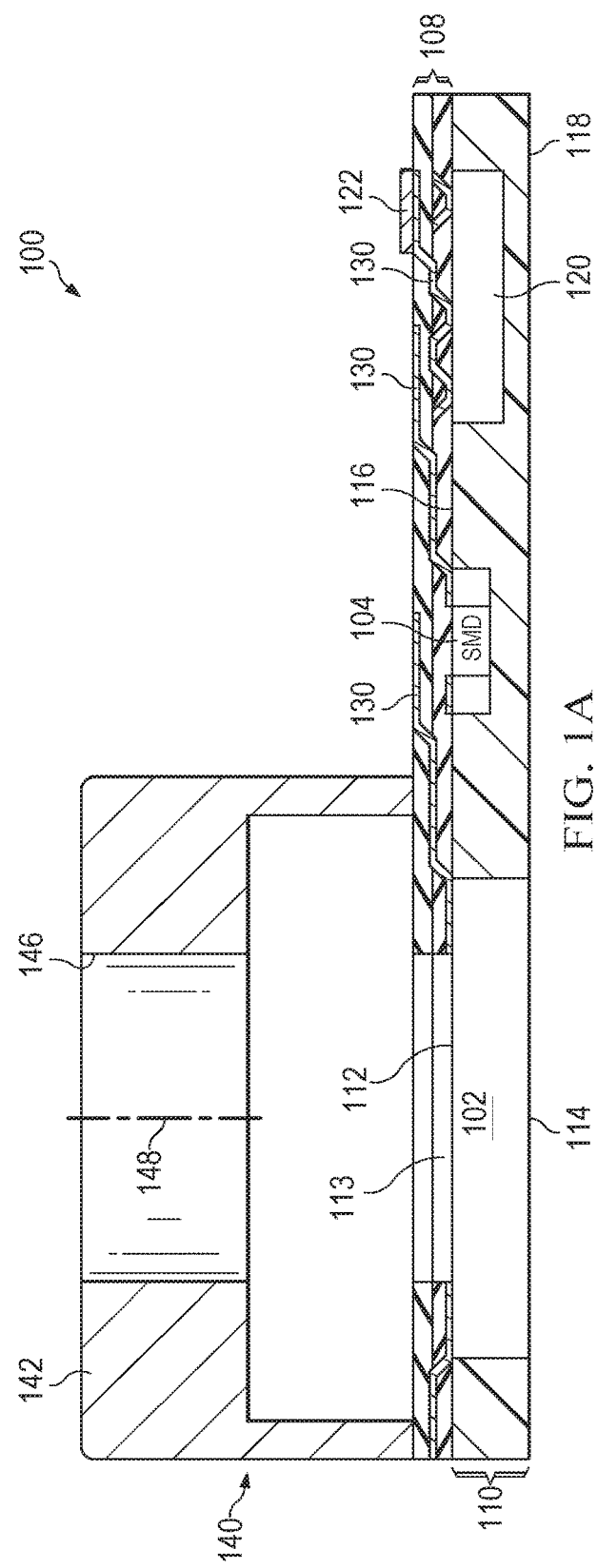
FIG. 1A is a cross-sectional view of a camera assembly with embedded components, in accordance with embodiments of the present invention.

FIG. 1A is a cross-sectional view of a camera assembly 100 with embedded components including image sensor 102, surface mount device ("SMD") 104, and memory 120. Various camera components, including image sensor 102, SMD 104, and/or memory 120 may be at least partially embedded in a molding compound 106 using techniques described in further detail below. In some examples, molding compound 106 may be an epoxy molding compound ("EMC") or a liquid molding compound. In some examples molding compound 106 may be a thermoset compound, which may be cured through the application of heat and/or pressure into a fused, insoluble polymer network. Molding compound 106 together with components at least partially embedded in, or fixed in, molding compound 106, such as image sensor 102, SMD 104, and/or memory 120, may be referred to herein as a camera component subassembly 110. The molding compound 106 provides structural support for the camera components. A thin redistribution layer 108 provides electrical interconnects for electrically coupling the camera components to contacts 122 on the surface of the camera assembly 100. These contacts 122 can be used to receive power or I/O signals and to electrically couple camera assembly 100 to another electronic device, such as, e.g., a main board of a computing device. In some examples, a camera component may be fixed in molding compound 106 such that one or more surfaces of the camera component is exposed on a surface of camera component subassembly 110. In the example depicted in FIG. 1A, surface 112 and surface 114 of image sensor 102 are at least partially exposed on surfaces 116 and 118, respectively, of camera component subassembly 110.

Image sensor 102 may include, for example, a complimentary metal oxide semiconductor ("CMOS") active pixel sensor or a charge-coupled device ("CCD") sensor effective to convert detected light into a voltage signal, and an optical filter 113, effective to selectively transmit light of different wavelengths. The optical filter 113 may be used for filtering undesirable wavelengths of light, such as infrared light, received by lens module 140 to prevent the light from reaching image sensor 102. In other embodiments, other types of optical filters may be used, such as, for example, a blue and/or other color filter, or a polarizing filter. The optical filter 113 may be coupled to the lens housing or coupled to a spacer between the lens housing and the image sensor 102. In various examples, an air gap may be left between optical filter 113 and lenses of lens module 140.

SMD 104 may be for example, one or more electronic components including resistors, capacitors, diodes, inductors, or the like, in accordance with the design of a desired camera assembly 100. Memory 120 may comprise, for example, a reprogrammable, non-volatile memory such as electrically erasable programmable read-only memory ("EEPROM"), NAND-type flash memory, and/or NOR-type flash memory. Although a single SMD 104 and a single memory 120 are depicted in FIG. 1A, any number of SMDs 104 and/or memories 120 may be used, in accordance with various camera assembly designs.

As will be described in further detail below, one or more redistribution layers (RDL) 108 may be formed on a surface of camera component subassembly 110. For example, in the example depicted in FIG. 1A, RDL 108 is formed on surface 116 of camera component subassembly 110. RDL 108 may comprise alternating dielectric passivation layers and conductive electroplating material, such as copper. RDL 108 may be deposited and etched in such a way as to form electrical interconnect circuitry. In various examples, interconnect circuitry formed in RDL 108 may electrically couple contacts of camera components at least partially embedded in molding compound 106 (including image sensor 102, SMD 104, and/or memory 120) to a plurality of contact pads 122, contact bumps, and/or output pins provided in a contact region 121. Accordingly, use of RDL 108 may avoid the need for printed circuit board substrates, soldering, and/or wire-bonding of different components within camera assembly 100.

The lens module 140 comprises an autofocus or fixed lens housing 142 forming a cavity containing one or more lenses 145 which are supported by a lens barrel 146. The lens module 140 may utilize voice coil motors (VCM) to move the lens barrel along the optical axis 148 of the camera. The VCM may also drive lateral movement of the lens barrel 146 orthogonal to the optical axis 148 in order to provide optical image stabilization to compensate for shaking or other movement of the camera. Alternatively, microelectromechanical systems (MEMS) actuators may be used to translate the lenses 145. A variety of camera modules, including a variety of multi-lens autofocus camera modules, are commercially available and may be utilized in accordance with various embodiments of the present invention.

As depicted in the example shown in FIG. 1A, if optical axis 148 is oriented in a vertical direction, one or more camera components such as SMD 104 and/or memory 120 may be oriented laterally in camera component subassembly to image sensor 102 with respect to optical axis 148. In some examples, image sensor 102, SMD 104 and/or memory 120 may be arranged horizontally with respect to one another, or along an axis that is orthogonal to optical axis 148 from image sensor 102. In some other examples, SMD 104 and/or memory 120 may be arranged horizontally from image sensor 102 with a vertical offset.

In various examples, where lens module 140 includes active electronic components, such as a VCM or MEMS actuators, lens module 140 may be electrically coupled to RDL 108. For example, lens module 140 may be electrically coupled through interconnect circuitry of RDL 108 to a contact pad 122, which may in turn be electrically coupled to a main board of a device in which camera assembly 100 is integrated, or with which camera assembly 100 is communicatively and/or electrically coupled. In some examples, contact pads 122 may be coupled to main board contacts on the main board of an electronic device. The contact pads 122 may receive all of the power and I/O signals required for operation of the camera assembly 100. The contact pads 122 can be bonded (e.g., soldered) directly to corresponding contacts on the main board, coupled to an LGA socket mounted to the main board, or coupled to another intermediate interposer structure, such as a cable or circuit board, which is coupled to the main board. Contact pads 122 may also be electrically coupled to one or more camera components (e.g., image sensor 102, SMD 104, and/or memory 120) at least partially embedded in camera component subassembly 110 through electrically conductive interconnect layers of RDL 108.

The camera assembly 100 may be incorporated into any of a variety of electronic devices. Although a few examples of electronic devices are discussed below, it should be understood that various other types of electronic devices that are capable of incorporating digital camera functionality can be used in accordance with various embodiments discussed herein. The electronic devices can include, for example, smartphones, electronic book readers, tablet computers, notebook computers, personal data assistants, cellular phones, video gaming consoles or controllers, television set top boxes, and portable media players, among others.

A portable computing device incorporating or configured in communication with camera assembly 100 may include a display (e.g., a liquid crystal display (LCD) element) operable to display image content to one or more users or viewers of the device. In at least some embodiments, such a display screen may provide for touch or swipe-based input using, for example, capacitive or resistive touch sensing technology.

Figure 1B:
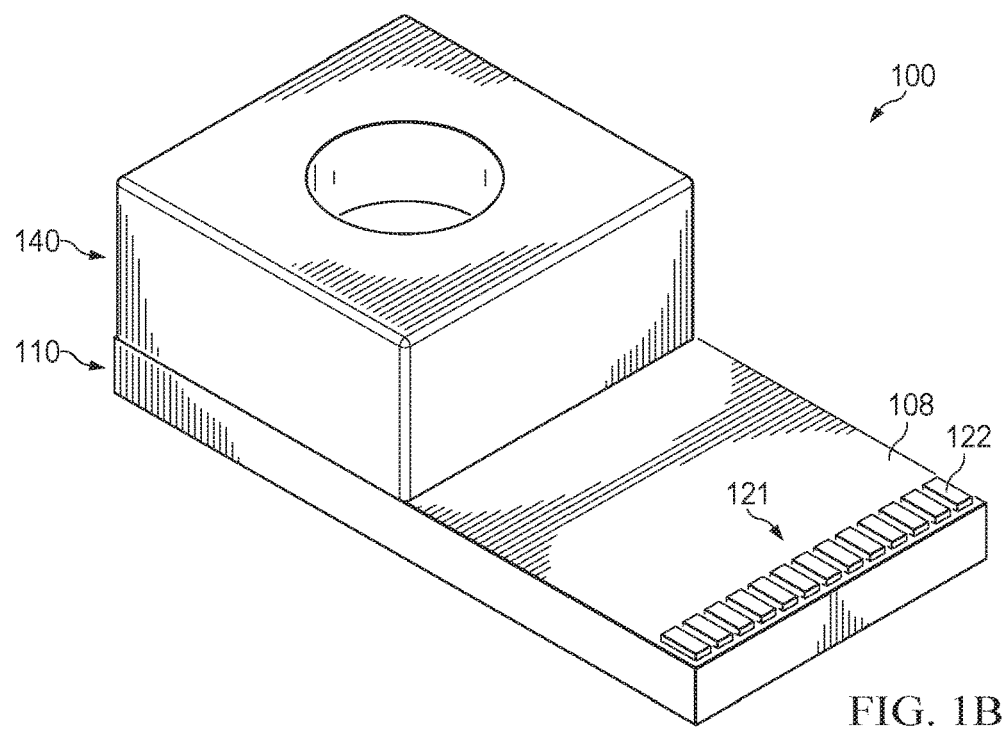
FIGS. 1B-1C illustrate top and bottom perspective views, respectively, of an example camera assembly with embedded components, in accordance with various embodiments of the present invention.
Figure 1C:
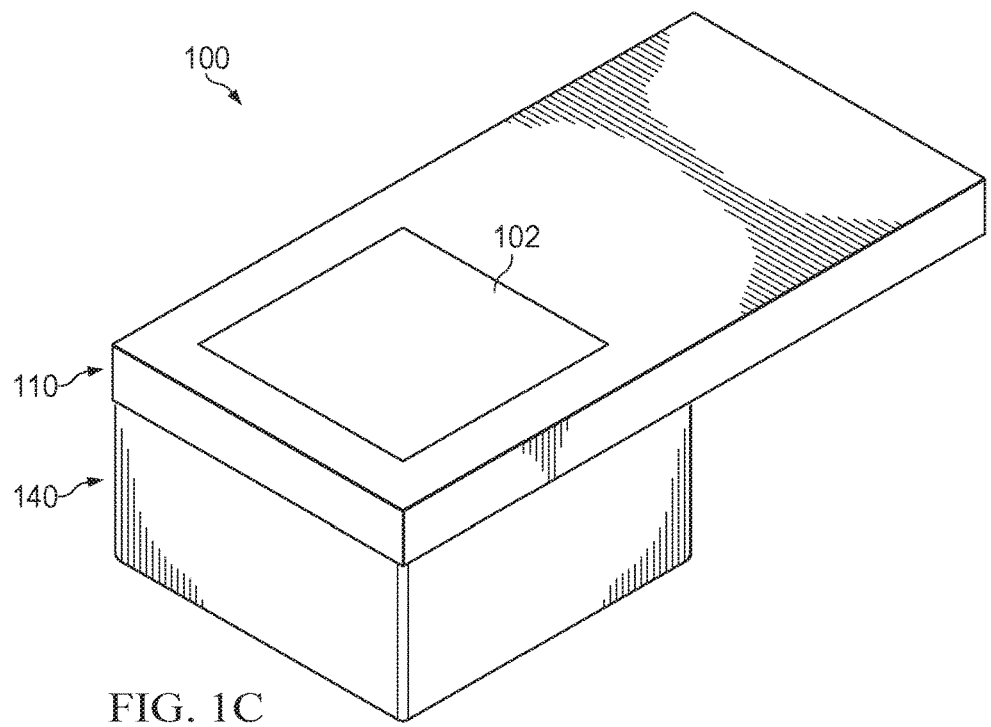

FIG. 1B illustrates a top perspective view of the example camera assembly 100 depicted in FIG. 1A showing contact region 121, lens module 140, and camera component subassembly 110. The top-most layer of RDL 108 is visible in FIG. 1B. Those components described previously with respect to FIG. 1A may not be discussed again herein, for purposes of clarity and brevity. FIG. 1C illustrates a bottom perspective view of the example camera assembly 100 depicted in FIGS. 1A and 1B. As shown in FIG. 1C, at least a portion of image sensor 102 (e.g., the back side of the image sensor 102) may be exposed on the bottom surface of camera component subassembly 110. In some examples, exposure of camera components on a surface of camera component subassembly 110 may provide beneficial heat dissipation when camera assembly 100 is in use and/or supplied with electrical current. Additionally, formation of camera component subassembly 110 in such a way that a surface of the thickest camera component (e.g., surface 114 of image sensor 102) is coplanar or "flush" with surface 118, may allow camera component subassembly 110 to be thinner relative to other designs in which molding material 106 completely embeds the thickest camera component, thereby allowing for a form factor of camera assembly 100 that is reduced in size relative to other designs.

Figure 1D:
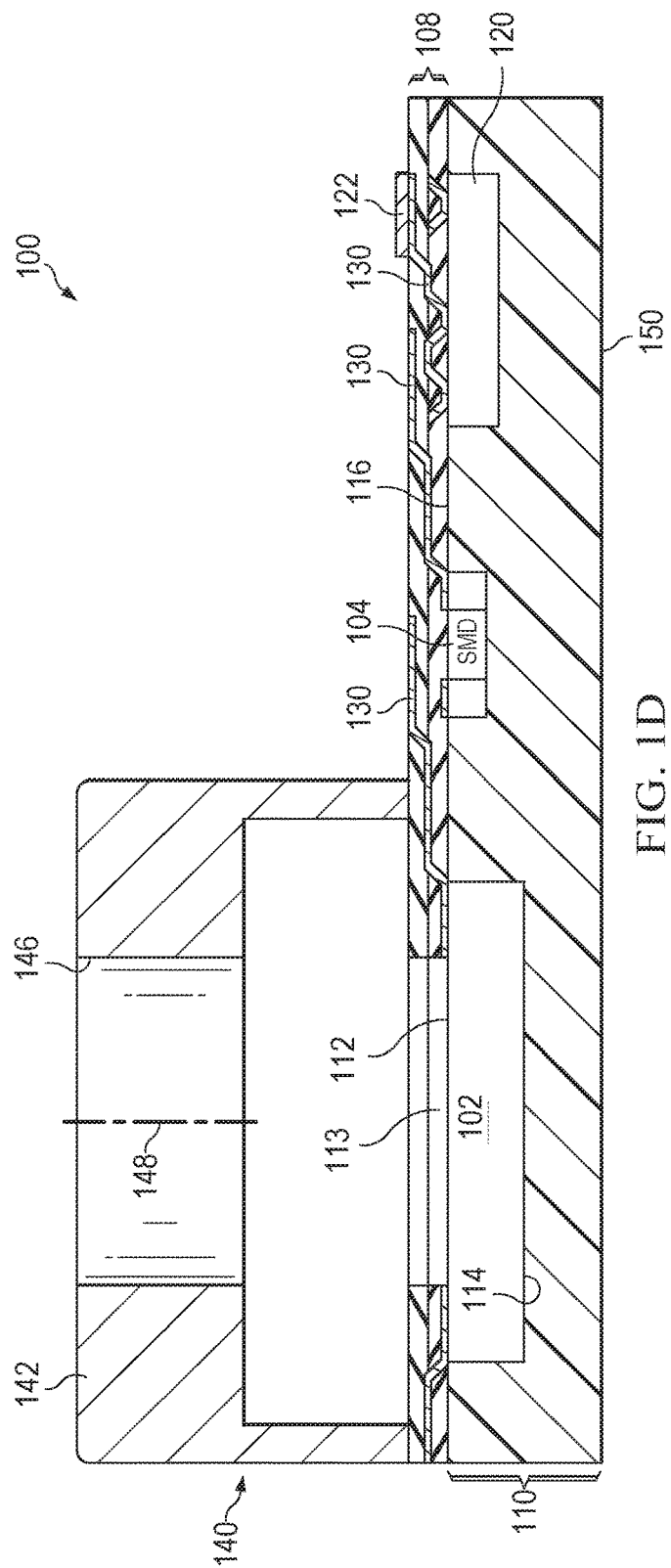
FIG. 1D is a cross-sectional view of a camera assembly with embedded components, in accordance with embodiments of the present invention.

FIG. 1D is a cross-sectional view of a camera assembly with embedded components wherein the back side of image sensor 102 is not exposed on a bottom surface 150 of camera component subassembly 110. Providing a layer of molding compound 106 underneath camera components, such as image sensor 102, may provide added structural integrity and rigidity of camera assembly 100 and may provide physical protection of components at least partially embedded within the molding compound 106 of the camera component subassembly 110. Additionally, in some implementations, it may be advantageous for camera module to be of a certain thickness or of a certain range of thicknesses. The example depicted in FIG. 1D may be formed with different thicknesses, depending on the thickness of molding compound 106 and the portion deposited underneath camera components when forming camera component subassembly 110.

Figure 1E:
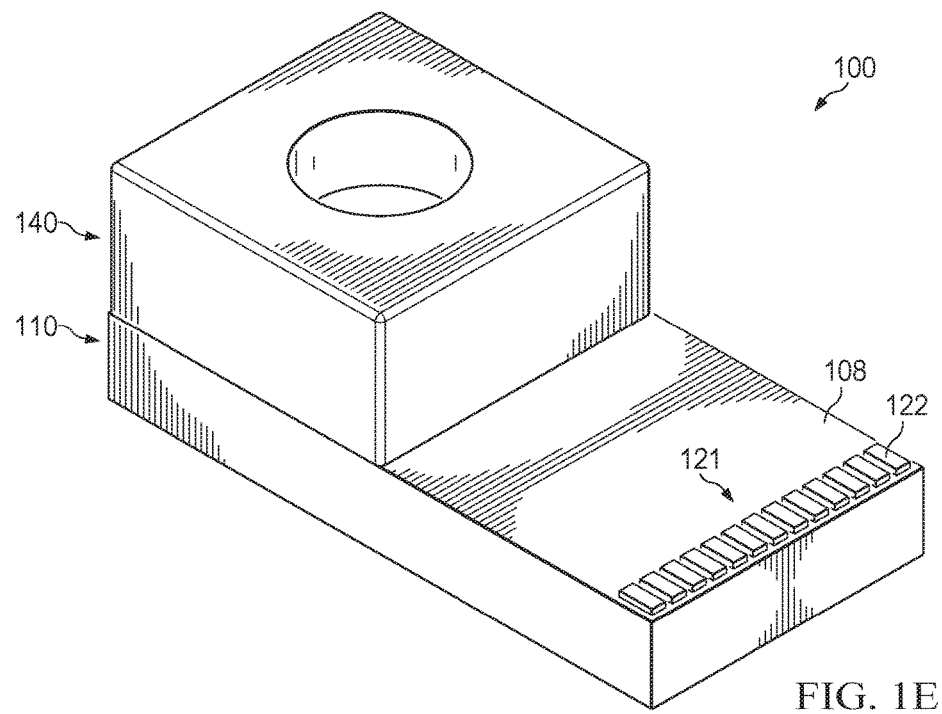
FIGS. 1E-1F illustrate top and bottom perspective views, respectively, of an example camera assembly with embedded components, in accordance with embodiments of the present invention.
Figure 1F:
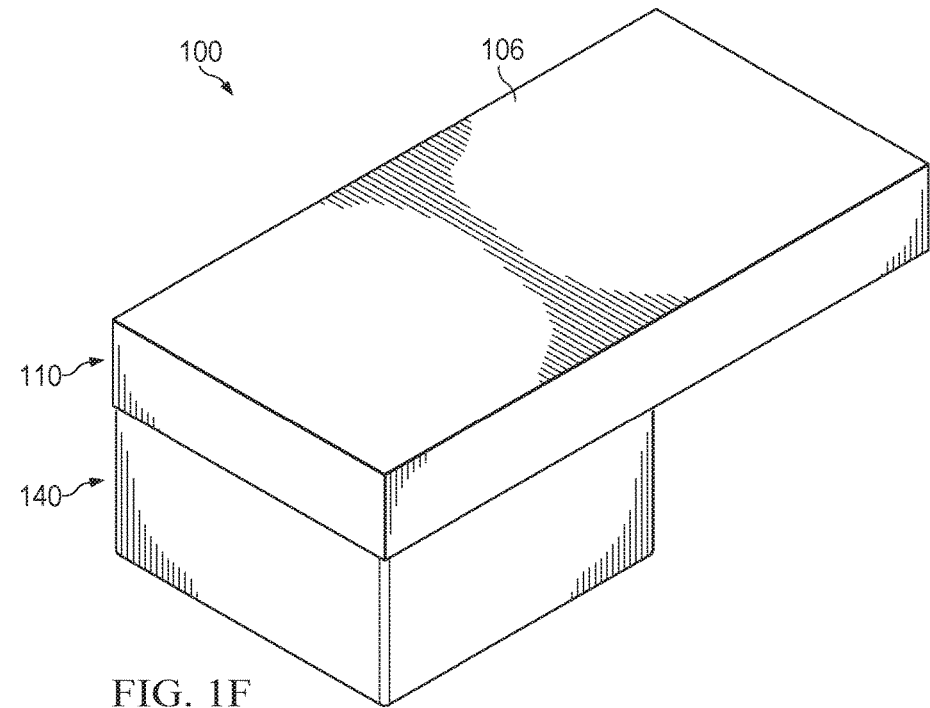

FIG. 1E illustrates a top perspective view of the example camera assembly 100 depicted in FIG. 1D showing contact region 121, lens module 140, and camera component subassembly 110. The top-most layer of RDL 108 is visible in FIG. 1E. Those components described previously with respect to FIGS. 1A-D may not be discussed again herein, for purposes of clarity and brevity. FIG. 1F illustrates a bottom perspective view of the example camera assembly 100 depicted in FIGS. 1D and 1E. As shown in FIG. 1F, molding compound 106 covers the entirety of the bottom surface of camera component subassembly 110. As discussed, the amount of molding compound 106 which is used to form the bottom layer of camera component subassembly 110 can be used to control the thickness and rigidity of camera component subassembly 110. Thicker and more rigid camera component subassemblies may be advantageous for some applications of camera assembly 100 depending on heat characteristics and physical characteristics of various implementations.

Figure 2:
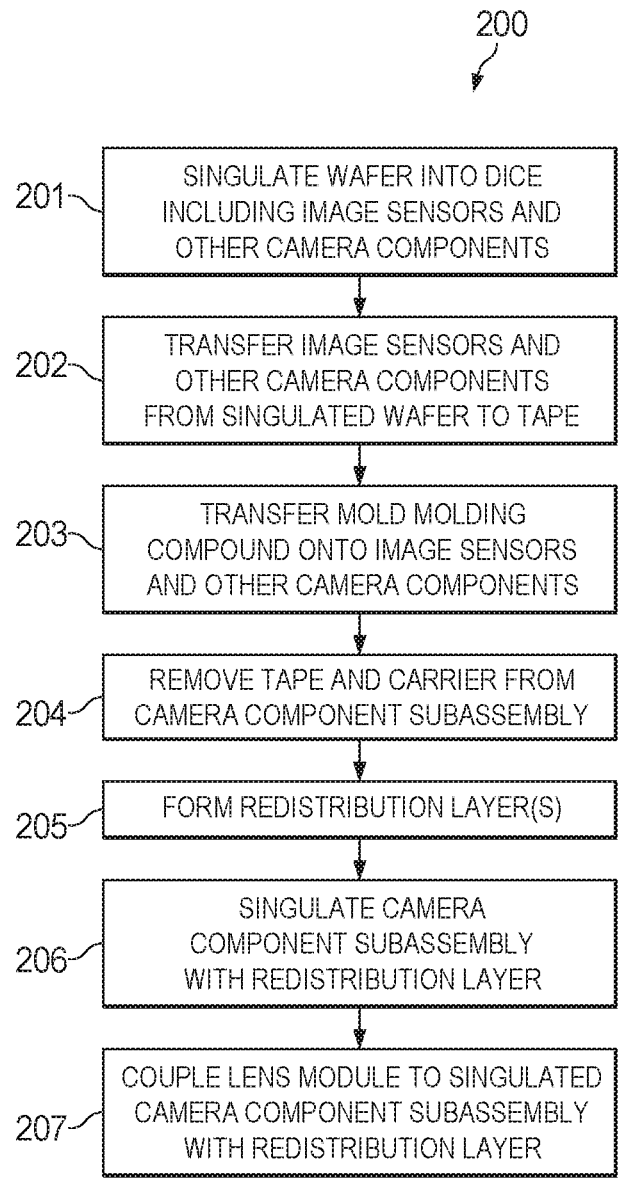
FIG. 2 is a flowchart illustrating a method of manufacturing a camera assembly with embedded components, in accordance with embodiments of the present invention.

FIG. 2 is a flowchart illustrating a method 200 of manufacturing a camera assembly 100 with an image sensor 102 and a plurality of other camera components at least partially embedded in camera component subassembly 110 via a transfer molding process. A redistribution layer (RDL) 108 is formed on a surface of the camera component subassembly 110. A plurality of contact pads 122 are coupled to RDL 108. At least one of the contact pads 122 is electrically coupled to the image sensor 102 via an interconnect of redistribution layer 108. A lens module 140 is coupled to redistribution layer 108 to form camera assembly 100. FIGS. 3A-3G illustrate various steps in the manufacturing method 200.

Figure 3A:
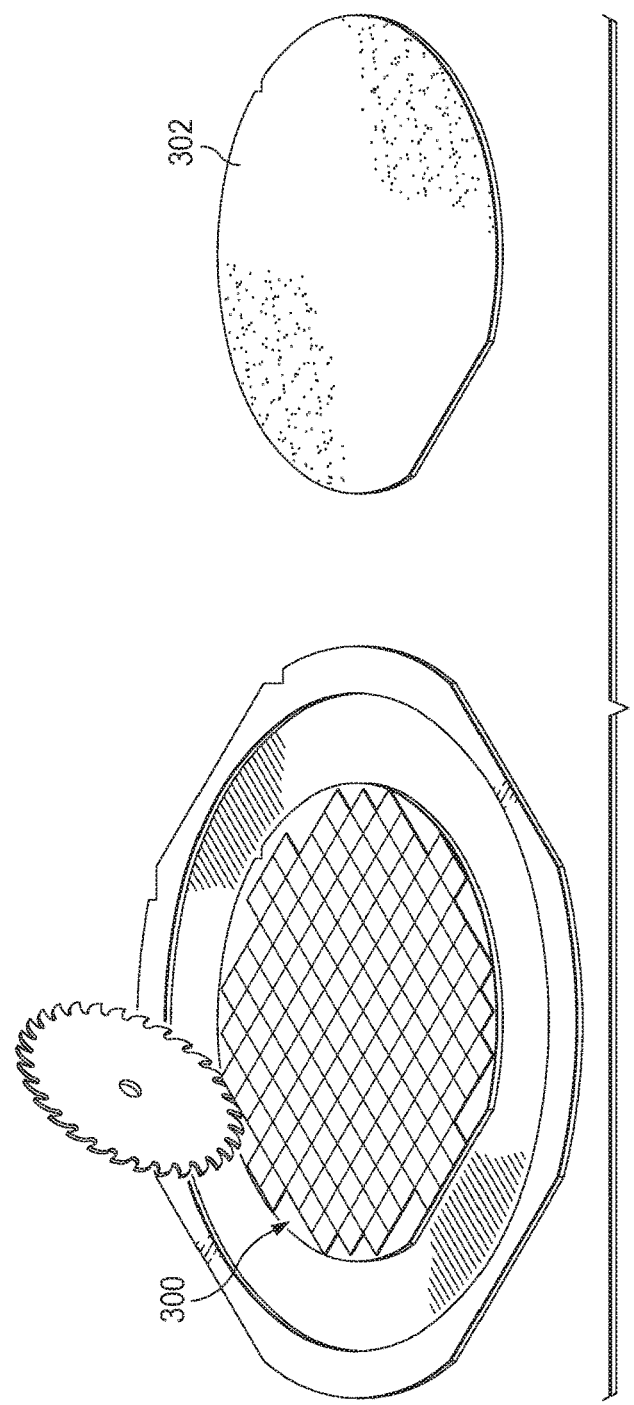
FIGS. 3A-3G illustrate various steps in the manufacturing process illustrated in FIG. 2.

In step 201, shown in FIG. 3A, a wafer 300 is singulated into dice including a plurality of image sensors 102 and/or other camera components (e.g. SMD 104 and/or memory 120). Image sensors 102 and other camera components may be included on dice of wafer 300. An adhesive layer, such as, e.g., tape 302 may be provided. The adhesive layer may comprise, for example, a thermal release tape, a teflon adhesive tape, an ultraviolet release tape, a laminate tape, or other material sufficient for retaining the image sensors 102 and camera components in place during subsequent steps described below. Thermal release tape may be, for example, an adhesive tape that adheres to objects at a first temperature (e.g., room temperature), but does not adhere as strongly at a second temperature that is higher than the first temperature and often may be easily removed after heating. Tape 302 may be provided on a carrier 304 (shown in FIG. 3B). Tape 302 may have a first side effective to couple to camera components and a second side coupled to carrier 304. Carrier 304 may be, for example, a bare silicon wafer on top of which the second side of tape 302 may be coupled. In examples where tape 302 is an ultraviolet release tape, carrier 304 may comprise a translucent material so that ultraviolet light may pass through carrier in order to separate the ultraviolet release tape 302 from the image sensors 102 and/or camera components. In examples where tape 302 is a thermal release tape, heat may be applied to tape 302 to release tape 302 from the image sensors 102 and/or camera components.

Figure 3B:
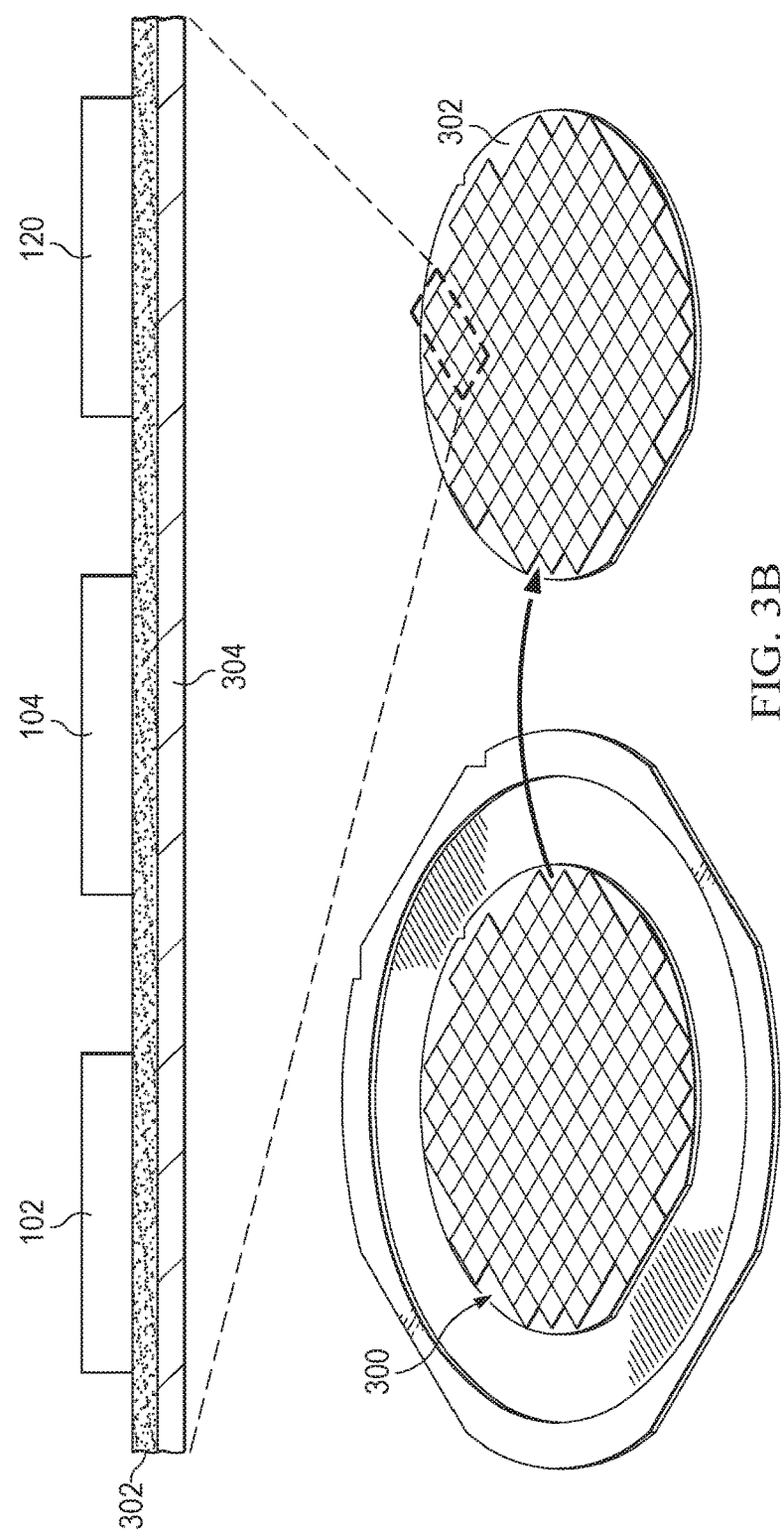

In step 202, shown in FIG. 3B, image sensors 102 and/or other camera components (such as SMDs 104 and/or memories 120) may be transferred from singulated wafer 300 to tape 302 in order to couple image sensors 102 and/or other camera components to tape 302. For example, images sensors 102 and/or other camera components may be inverted and placed on tape 302 such that the image capturing side of the image sensor 102 is facing downward towards the tape. Although in FIG. 3B image sensor 102, SMD 104, and memory 120 appear to be of uniform height or thickness, in some cases the height or thickness of camera components such as image sensor 102, SMD 104, and memory 120 may vary vis-à-vis one another. Additionally, when transferring camera components (such as image sensor 102, SMD 104, and/or memory 120) from singulated wafer 300 to tape 302, camera components may be arranged according to a particular design. For example, gaps may be left between adjacent camera components to reduce parasitic capacitance and/or heat transfer between components. In some other examples, camera components may be arranged in close proximity, or in physical contact with one another, in order to minimize a footprint of camera assembly 100.

Figure 3C:
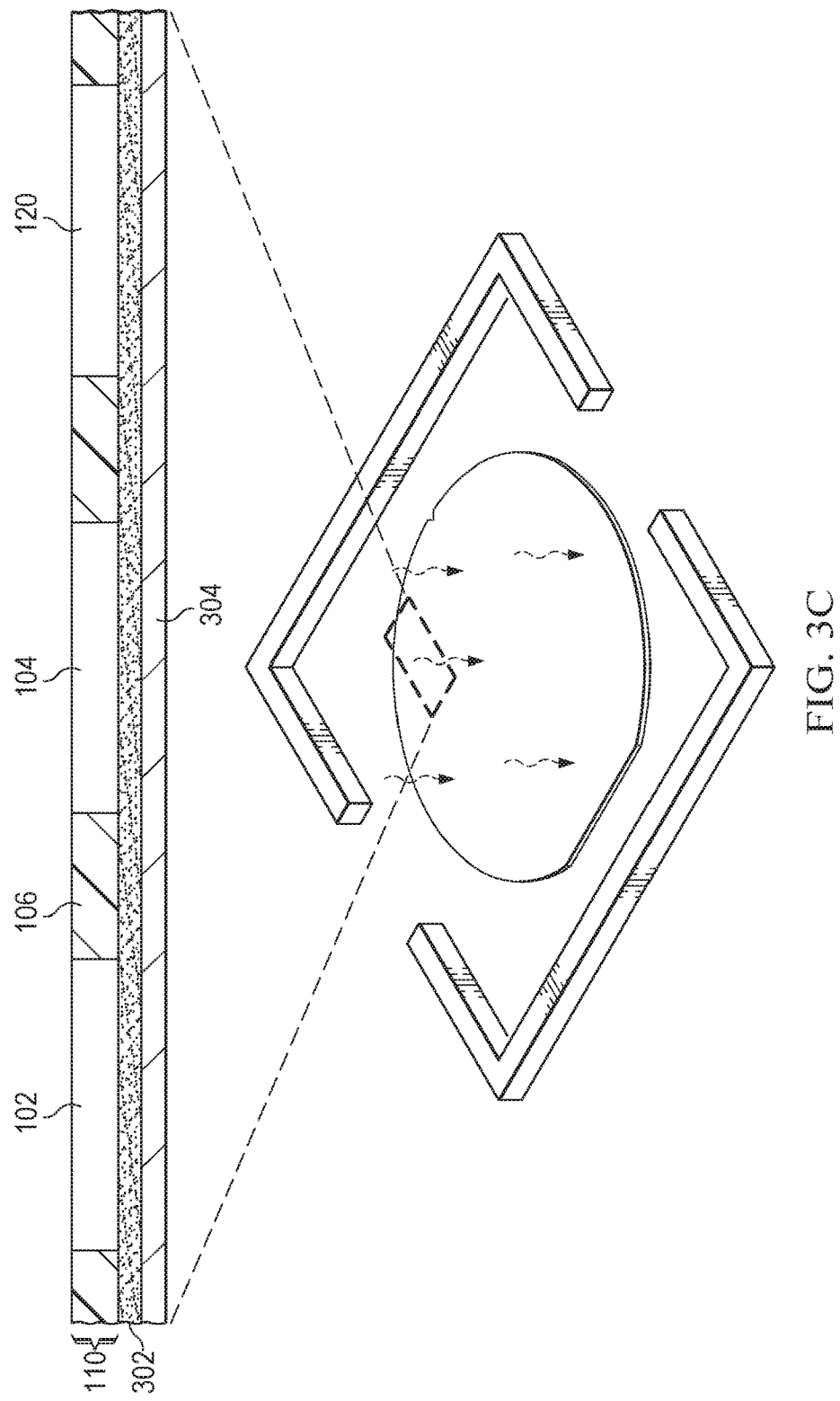

In step 203, shown in FIG. 3C, a molding compound 106 is transfer molded onto camera components such as image sensor 102, SMD 104, and/or memory 120 and onto tape 302. Molding compound 106 may be, for example, a thermoset molding compound. Molding compound 106 may be pressurized and/or heated during the transfer molding process and may cure into a fused, insoluble polymer network. Molding compound 106 may fill spaces between, and at least partially embed, camera components within molding compound 106 on tape 302. Additionally, molding compound 106, once cured and solidified, may adhere to camera components and may fuse camera components into camera component subassembly 110. In some examples, portions of camera components (e.g. surface 114 of image sensor 102 depicted in FIG. 1A) may be exposed on camera component subassembly 110.

Figure 3D:
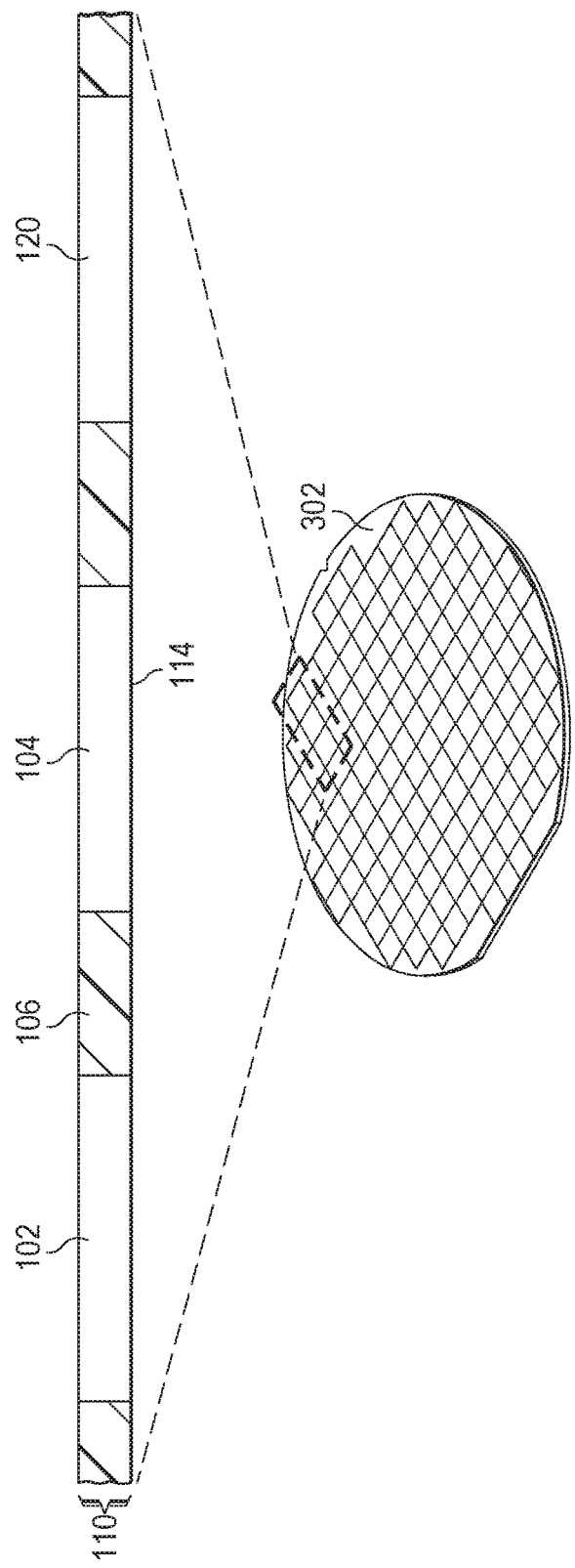

In step 204, shown in FIG. 3D, after molding compound 106 is transfer molded onto camera components such as image sensor 102, SMD 104, and memory 120, tape 302 may be removed in order to remove camera component subassembly 110 from tape 302 and carrier 304. In examples where tape 302 is thermal release tape, heat may be applied to tape 302 to separate tape 302 from camera component subassembly 110. In examples where tape 302 is ultraviolet (UV) release tape, tape 302 may be exposed to ultraviolet light which may cause tape 302 to release from camera component subassembly 110. In other examples where tape 302 is adhesive tape, such as teflon tape, tape 302 may be peeled away from camera component subassembly 110. Removal of tape 302 may at least partially expose a surface of camera components that are at least partially embedded in camera component subassembly 110. For example, in FIG. 3D, surface 114 of image sensor 102 is at least partially exposed on camera component subassembly 110. Exposure of portions of the camera components may provide access to electrical contact areas of the camera components which may be electrically coupled through a redistribution layering process to other contact pads according to various designs of camera assemblies 100.

Figure 3E:
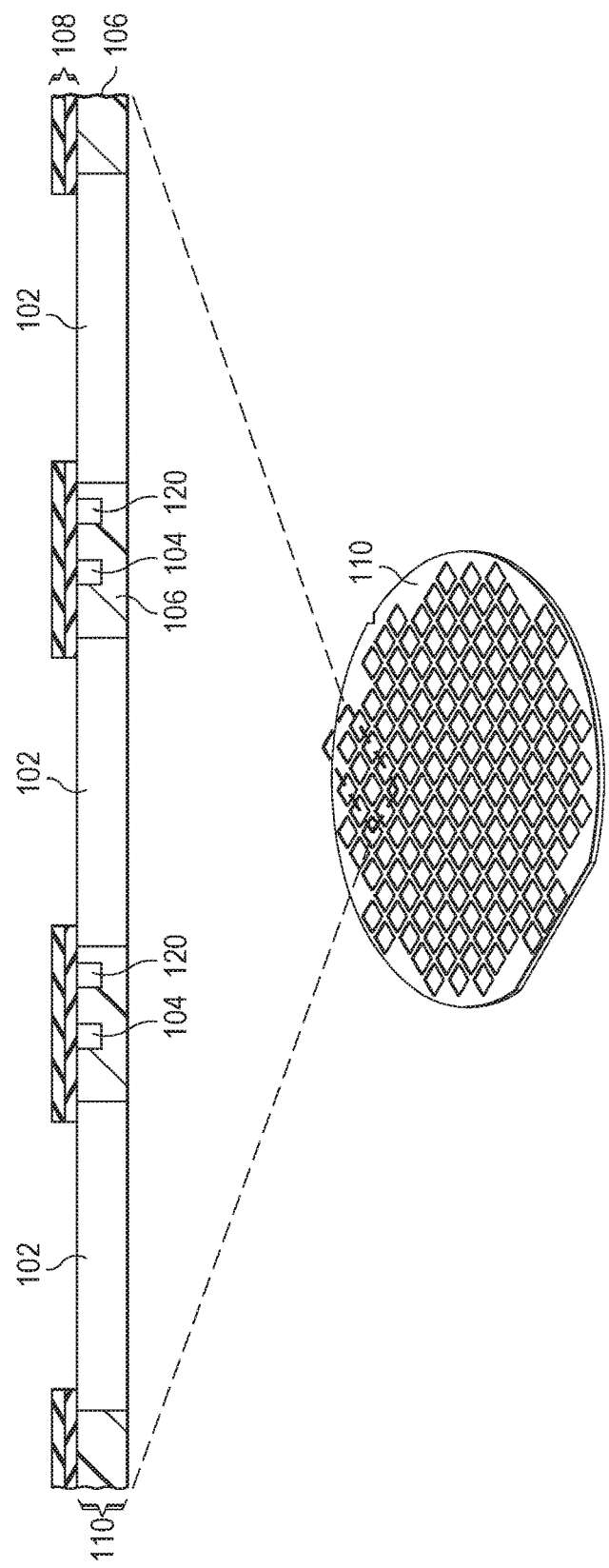

In step 205, shown in FIG. 3E, RDL 108 may be formed on camera component subassembly 110. RDL 108 may be formed on a surface of camera component subassembly 110 that includes exposed portions and/or surfaces of camera components, such as image sensor 102, SMD 104, and/or memory 120. RDL 108 may be effective to electrically couple exposed contact areas of camera components at least partially embedded in camera component subassembly 110 to other contact pads, such as, for example, contact pads 122 depicted in FIG. 1A. In various examples, RDL 108 may have a thickness of less than about 0.1 mm.

An example process for forming RDL 108 is described below. Forming RDL 108 may include depositing a passivation layer which may cover the surface of camera component subassembly 110 except for contact pads of image sensor 102 and/or other camera components such as SMD 104 and memory 120. In some examples, the passivation layer may include a nitride layer to protect camera components. A first polymer layer may be formed on the passivation layer. The first polymer layer may include openings so that contact pads of the various camera components at least partially embedded in camera component subassembly 110 remain exposed. The first polymer layer may serve both as a buffer layer for thermal stress and as a dielectric layer. In various examples, the first polymer layer may comprise polyimide, polybenzoxazole (PBO), benzocyclobutene (BCB), epoxy, etc. The first polymer layer may be formed, for example, by coating camera component subassembly 110 with a polymer material and then removing the portions of the polymer material that overlies contact pads of the at least partially embedded camera components. In various examples, photolithography may be used to remove portions of polymer material overlying camera component contact pads. In some examples, after depositing the first polymer layer, an Under Barrier Metal (UBM) layer may be deposited. The UBM layer may be electrically conductive, and may therefore be deposited both on the first polymer layer and on the exposed camera component contact pads. The UBM layer may be formed by sputtering and may serve to promote adhesion of a conductive redistribution layer to be subsequently applied. UBM layers may be formed from, for example, combinations of titanium and copper, and/or other metals.

A conductive material, such as copper, may be formed on the UBM layer. The conductive material may provide electrically conductive redistribution patterns 130 (depicted in FIG. 1A) for rerouting the contact pads of the at least partially embedded camera components. To form the redistribution patterns 130, a photoresist may be coated on the UBM layer according to a desired pattern of interconnect circuitry. Copper may be plated on exposed portions of the UBM layer. The copper may remain with a thickness of approximately 5 μm where the photoresist pattern has exposed the copper. A barrier metal may be formed on top of the copper redistribution patterns 130 to prevent oxidation of the copper redistribution patterns 130. In some examples, the barrier metal may comprise chrome (Cr) or nickel (Ni).

The barrier metal and UBM layer may serve as plating electrodes and the barrier metal may be plated on the copper redistribution pattern exposed through the photoresist pattern. After the plating, the photoresist pattern may be removed and the UBM layer may be etched using the redistribution pattern as a mask. Accordingly, the UBM layer may remain only under the redistribution pattern. A second polymer layer may be formed over the barrier metal to protect the copper redistribution pattern from the environment and may serve as a dielectric layer to electrically isolate the redistribution pattern. Portions of the second polymer layer may be removed, as desired, via photolithography in order to expose portions of the copper redistribution pattern for external connecting electrodes, such as contact pads 122 (depicted in FIGS. 1A, 1B, 1D, and 1E, for example). In some examples, contact pads 122 may comprise solder balls, conductive epoxy, and/or bumps made of copper, gold, or nickel.

Figure 3F:
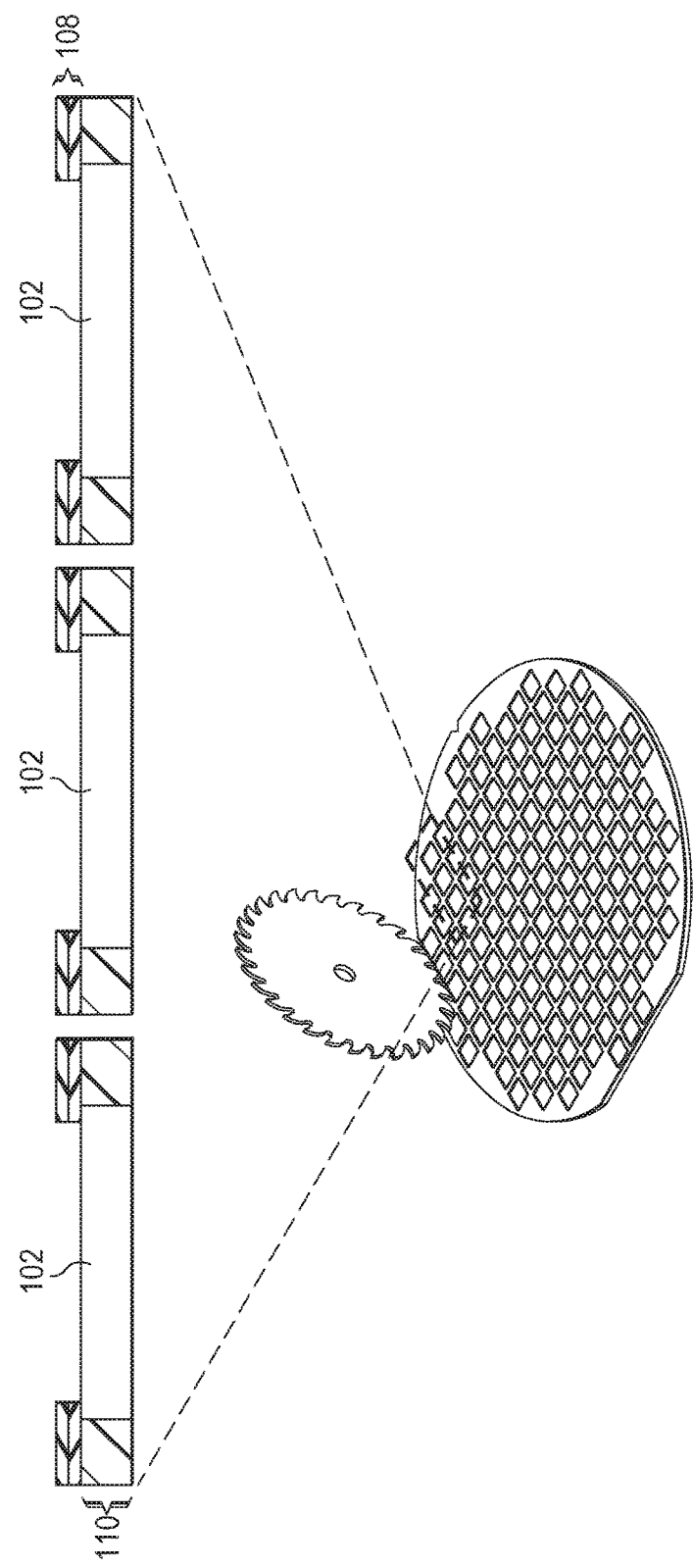

In step 206, shown in FIG. 3F, camera component subassembly 110, including RDL 108 may be singulated. Camera component subassembly 110 may be singulated into a plurality of dice. It should be noted that each singulated die may include all camera components (such as image sensor 102, SMDs 104, and/or memory 120, depicted in FIG. 1A) of the particular camera assembly 100 being manufactured.

Figure 3G:
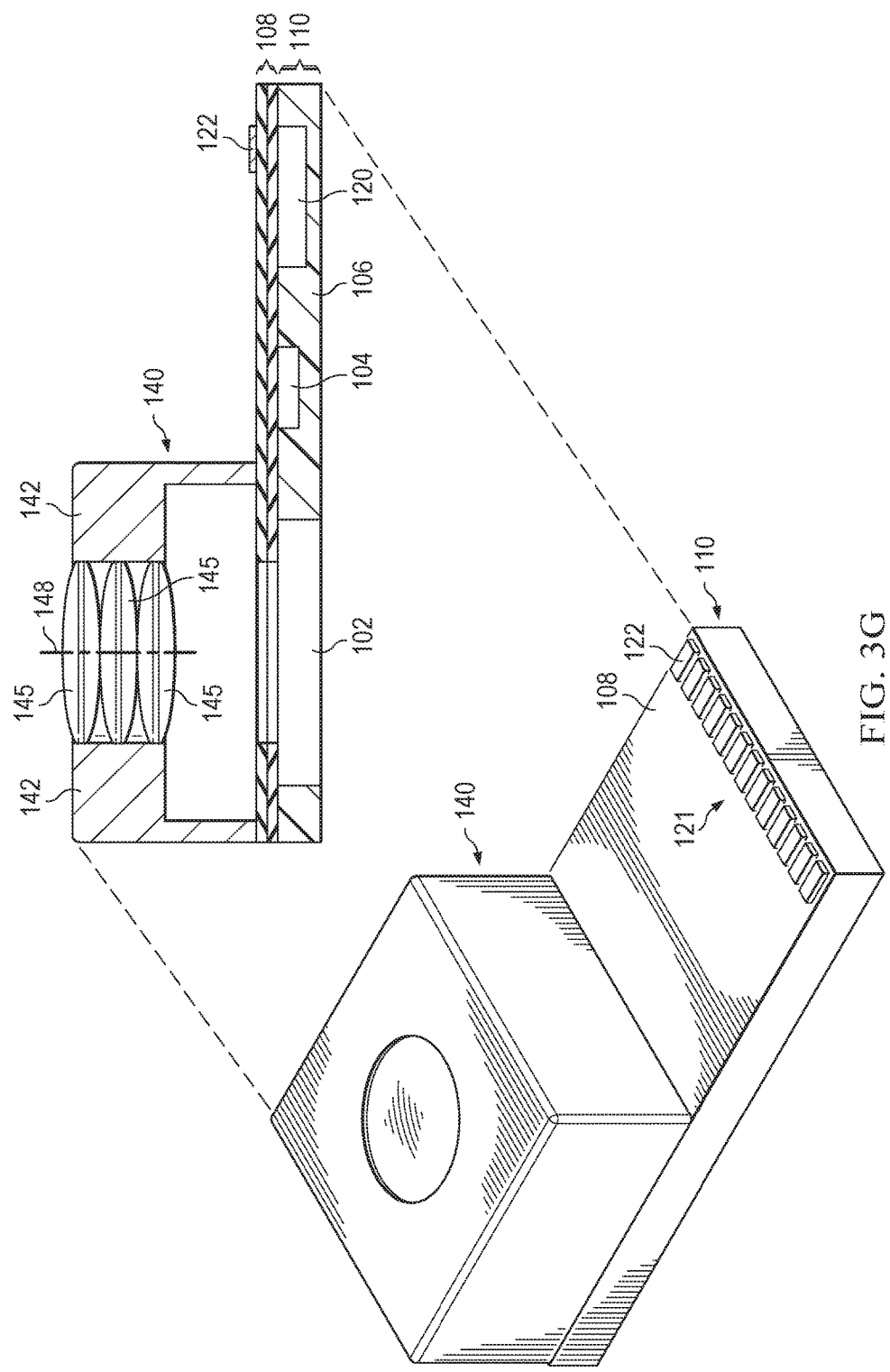

In step 207, shown in FIG. 3G, a lens module 140 may be coupled to each of the plurality of singulated dice. Lens module 140 may include one or more lenses 145, and lens housing 142. In various examples, where lens module 140 includes active electronic components, such as a VCM or MEMS actuators, lens module 140 may be electrically coupled to RDL 108. For example, lens module 140 may be electrically coupled through interconnect circuitry of RDL 108 to a contact pad 122, or another contact pad, which may in turn be electrically coupled to a main board of a device in which camera assembly 100 is integrated, or with which camera assembly 100 is communicatively coupled. Lens module 140 may be electrically coupled to RDL 108 using solder, conductive epoxy, ball bonding, wire bonding, or other types of electrical coupling known to those skilled in the art. In examples where lens module 140 is of fixed focus and includes no electronic components, lens module 140 may be coupled to RDL 108 or camera component subassembly 110 without requiring any electrical coupling. For example, a fixed-focus lens module 140 may be coupled to RDL 108 or to camera component subassembly 110 using an adhesive. Lens module 140 may be coupled to RDL 108 in a position such that lens module 140 overlies and is aligned with an optical sensor of image sensor 102 along optical axis 148.

In various examples, image sensor 102 may be about 0.2 to about 0.3 mm in height or thickness. Accordingly, in some examples, camera component subassembly may have a thickness of about 0.2 to about 0.3 mm. RDL 108 may have a thickness of less than about 0.1 mm. Accordingly, in the examples depicted in FIG. 3G, camera component subassembly 110 together with RDL 108 may have a thickness of about 0.2 to about 0.3 mm. The thickness of lens module 140 may vary according to different commercially available designs of lens modules.

Figure 4A:
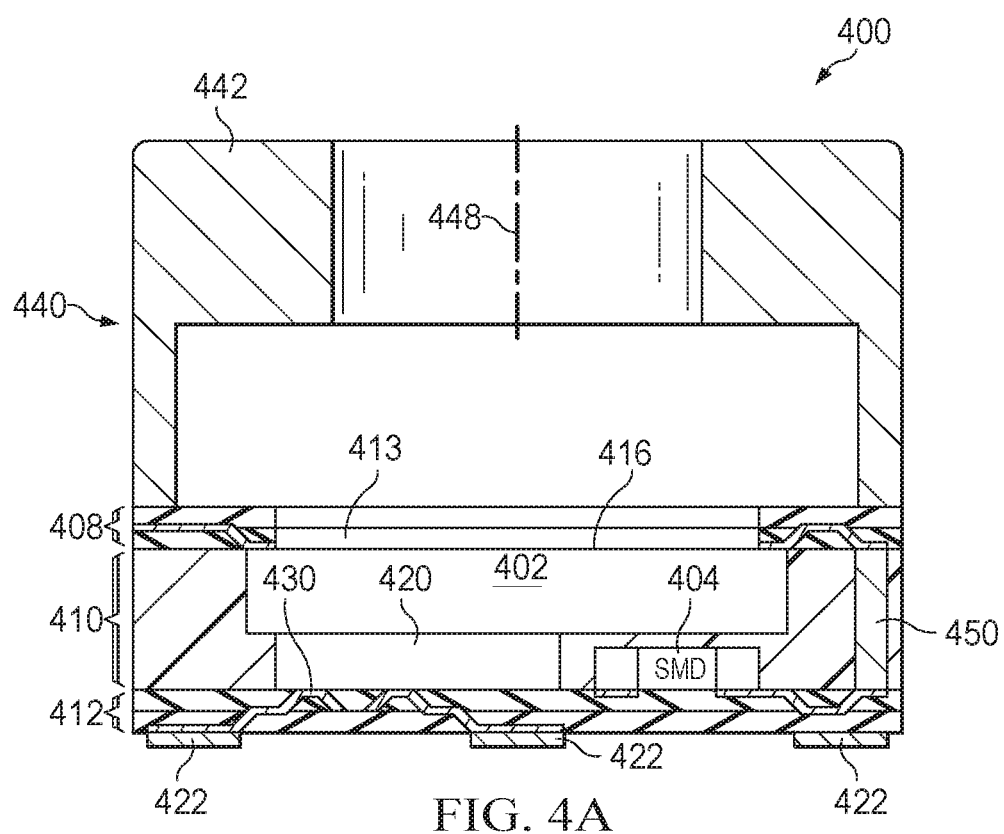
FIG. 4A is a cross-sectional view of a camera assembly with embedded components, in accordance with embodiments of the present invention.

FIG. 4A is a cross-sectional view of a camera assembly 400 with embedded components, including image sensor 402, surface mount device ("SMD") 404, and memory 420. Various camera components, including image sensor 402, SMD 404, and/or memory 420 may be at least partially embedded in a molding compound 406 using techniques described in further detail below. In some examples, molding compound 406 may be an epoxy molding compound ("EMC") or a liquid molding compound. In some examples molding compound 406 may be a thermoset compound, which may be cured through the application of heat and/or pressure into a fused, insoluble polymer network. Molding compound 406 together with components at least partially embedded in, or fixed in, molding compound 406, such as image sensor 402, SMD 404, and/or memory 420, may be referred to herein as a camera component subassembly 410. In some examples, a camera component may be fixed in molding compound 406 such that one or more surfaces of the camera component is exposed on a surface of camera component subassembly 410.

Image sensor 402 may include, for example, a complimentary metal oxide semiconductor ("CMOS") active pixel sensor or a charge-coupled device ("CCD") sensor effective to convert detected light into a voltage signal, and a optical filter 413, effective to selectively transmit light of different wavelengths. The optical filter 413 may be used for filtering undesirable wavelengths of light, such as infrared light, received by lens module 440 to prevent the light from reaching image sensor 402. In other embodiments, other types of optical filters may be used, such as, for example, a blue and/or other color filter, or a polarizing filter. The optical filter 413 may be coupled to the lens housing or coupled to a spacer between the lens housing and the image sensor 402. In various examples, an air gap may be left between optical filter 413 and lenses of lens module 440.

SMD 404 may be for example, one or more electronic components including resistors, capacitors, diodes, inductors, or the like, in accordance with the design of a desired camera assembly 400. Memory 420 may be for example, a reprogrammable, non-volatile memory such as electrically erasable programmable read-only memory ("EEPROM"), NAND-type flash memory, or NOR-type flash memory. Although a single SMD 404 and a single memory 420 are depicted in FIG. 4A, any number of SMDs 404 and/or memories 420 may be used, in accordance with various camera assembly designs.

As will be described in further detail below, one or more redistribution layers (RDL) 408, 412 may be formed on surfaces of camera component subassembly 410. For example, in the example depicted in FIG. 4A, RDL 408 may be formed on top surface 416 of camera component subassembly 410. RDL 412 may be formed on bottom surface 418 of camera component subassembly 410. Top surface 416 and bottom surface 418 may be substantially parallel to one another. RDLs 408, 412 may comprise alternating dielectric passivation layers and interconnect layers comprising conductive electroplating material, such as copper. RDLs 408, 412 may be deposited and etched in such a way as to form interconnect circuitry. In various examples, interconnect circuitry formed in RDLs 408, 412 may electrically couple contacts of camera components at least partially embedded in molding compound 406 (including image sensor 402, SMD 404, and/or memory 420) to bond pads, contact bumps, and/or output pins, such as contact pad 422, of camera assembly 400. Accordingly, use of RDLs 408 may avoid the need for printed circuit board substrates, soldering, and/or wire-bonding of different components within camera assembly 400. One or more vias 450 may be formed through molding compound 406 of camera component subassembly 410, as will be described in further detail below. Via 450 may comprise a channel formed through molding compound 406 of camera component subassembly 410. The channel may be plated and/or filled with an electrically conductive material, such as copper, chromium, and/or nickel. In an example, the electrically conductive material may be deposited in the channel through electroplating. Via 450 may electrically couple RDL 408, and interconnect circuitry of RDL 408, to RDL 412, and interconnect circuitry of RDL 412.

The lens module 440 comprises an autofocus or fixed lens housing 442 forming a cavity containing one or more lenses 445 which are supported by a lens barrel 446. The lens module 440 may utilize voice coil motors (VCM) to move the lens barrel along the optical axis 448 of the camera. The VCM may also drive lateral movement of the lens barrel 446 orthogonal to the optical axis 448 in order to provide optical image stabilization to compensate for shaking or other movement of the camera. Alternatively, microelectromechanical systems (MEMS) actuators may be used to translate the lenses 445. A variety of camera modules, including a variety of multi-lens autofocus camera modules, are commercially available and may be utilized in accordance with various embodiments of the present invention.

In various examples, where lens module 440 includes active electronic components, such as a VCM or MEMS actuators, lens module 440 may be electrically coupled to RDL 408. For example, lens module 440 may be electrically coupled through interconnect circuitry of RDL 408 to via 450, and from via 450 to interconnect circuitry of RDL 412, and from interconnect circuitry of RDL 412 to one or more contact pads 422. Contact pads 422 may in turn be electrically coupled to a main board of a device in which camera assembly 400 is integrated, or with which camera assembly 400 is communicatively coupled. In some examples, contact pads 422 may be coupled to main board contacts on the main board of an electronic device. The contact pads 422 may receive all of the power and I/O signals required for operation of the camera assembly 400. The contact pads 422 can be bonded (e.g., soldered) directly to corresponding contacts on the main board, coupled to an LGA socket mounted to the main board, or coupled to another intermediate interposer structure, such as a cable or circuit board, which is coupled to the main board. Contact pads 422 may also be electrically coupled to one or more camera components (e.g., image sensor 402, SMD 404, and/or memory 420) at least partially embedded in camera component subassembly 410 through interconnect layers of RDLs 408, 412.

As depicted in the example shown in FIG. 4A, image sensor 402 and one or more other camera components such as memory 420 and/or SMD 404 may be arranged in a "stacked" or vertical orientation. For example, at least a portion of image sensor 402 may overlie at least a portion of memory 420 and/or SMD 404 along optical axis 448. Such a stacked or vertical arrangement may allow for a smaller footprint form factor for camera assembly 400.

Figure 4B:
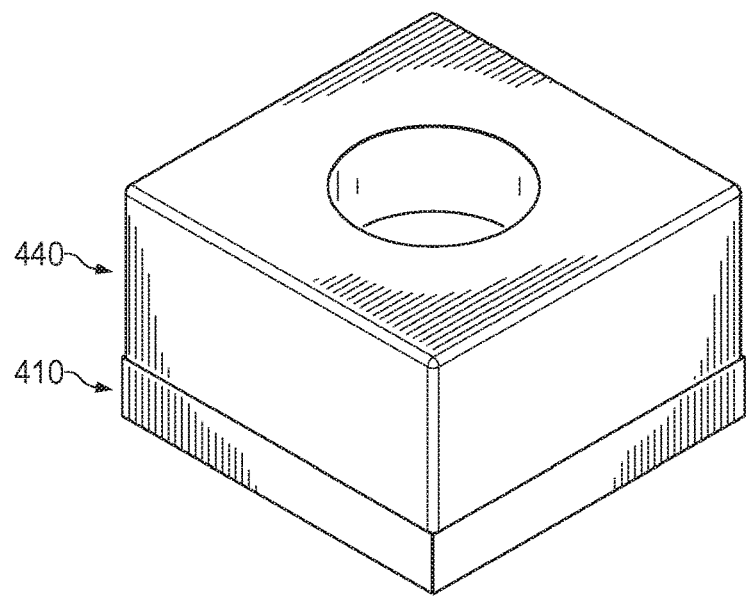
FIGS. 4B-4C illustrate top and bottom perspective views, respectively, of an example camera assembly with embedded components, in accordance with various embodiments of the present invention.
Figure 4C:
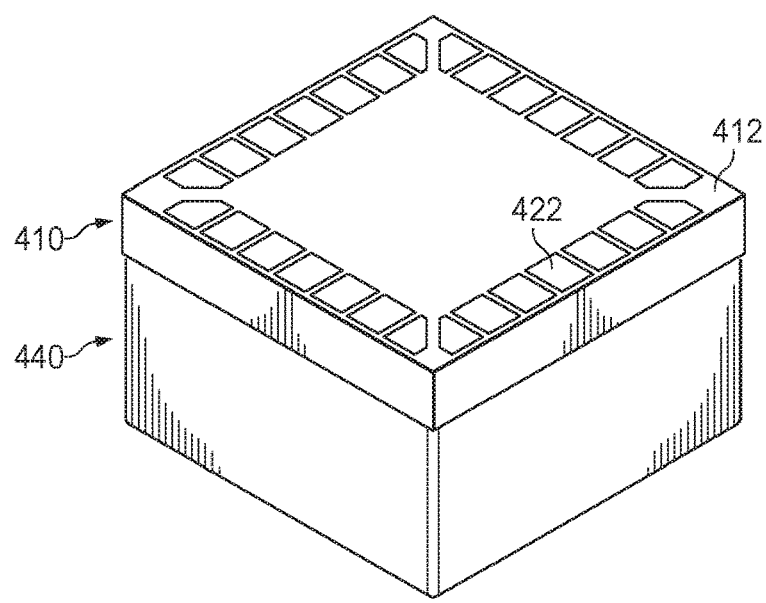

FIG. 4B illustrates a top perspective view of the example camera assembly 400 depicted in FIG. 4A including lens module 440 and camera component subassembly 410. Those components described previously with respect to FIG. 4A will not be discussed again herein, for purposes of clarity and brevity. FIG. 4C illustrates a bottom perspective view of the example camera assembly 400 depicted in FIGS. 4A and 4B. A bottom surface of RDL 412 is visible in FIG. 4C. Additionally, contact pads 422 are visible on the bottom surface of RDL 412. In various examples, contact pads 422 may be attached to the bottom surface of RDL 412 by soldering, bonding, conductive epoxy or another suitable method for electrically coupling contact pads 422 to interconnect circuitry included in RDL 412.

Figure 5:
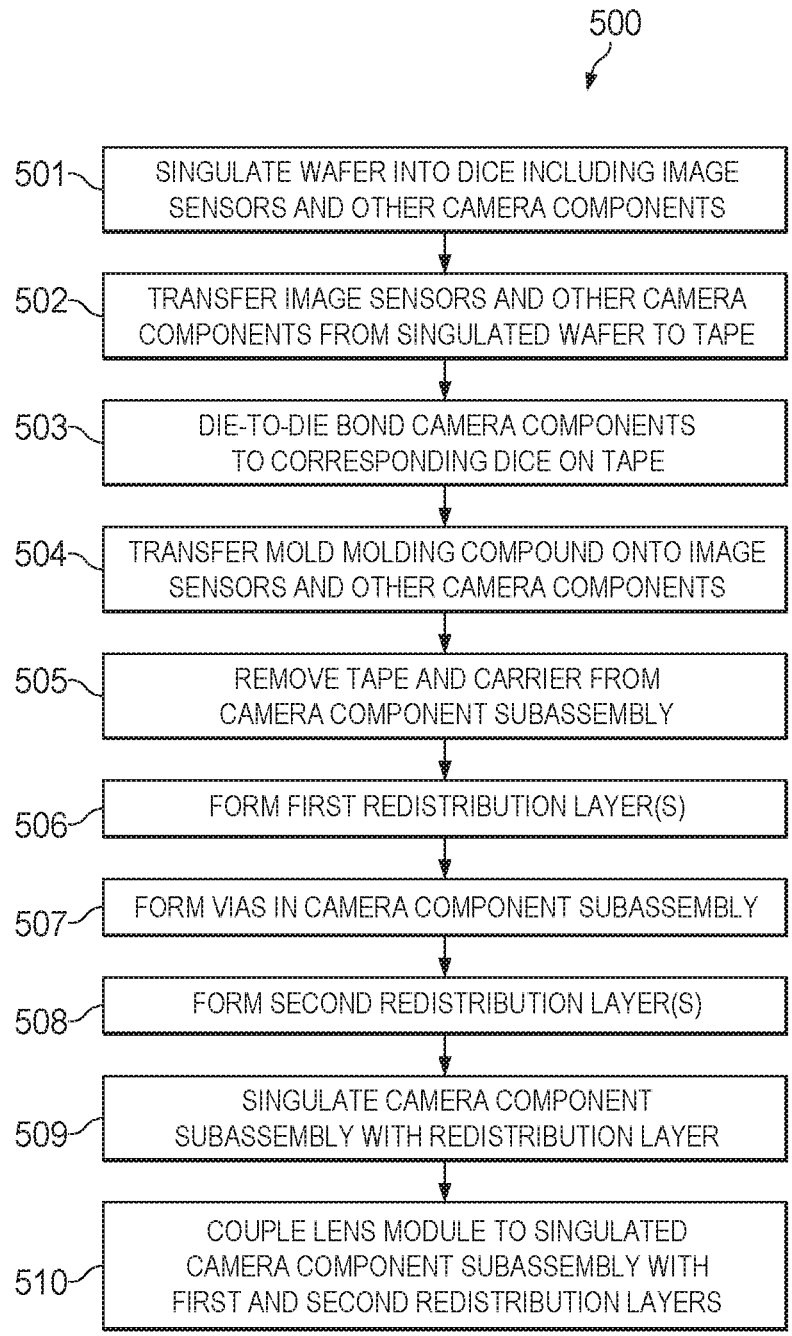
FIG. 5 is a flowchart illustrating a method of manufacturing a camera assembly with embedded components, in accordance with embodiments of the present invention.

FIG. 5 is a flowchart illustrating a method 500 of manufacturing a camera assembly 400 with an image sensor 402 and a plurality of other camera components at least partially embedded in a camera component subassembly 410 via a transfer molding process. A redistribution layer (RDL) 408 is formed on a first surface of the camera component subassembly 410. Through-package vias are formed in the camera component subassembly 410. An RDL 412 is formed on a second surface of the camera component subassembly 410. A plurality of contact pads 422 are coupled to a surface of RDL 412. At least one of the contact pads 422 is electrically coupled to the image sensor 402 via an interconnect of redistribution layer 412. A lens module 440 is coupled to redistribution layer 408 to form camera assembly 400. FIGS. 6A-6J illustrate various steps in the manufacturing method 500.

Figure 6B:
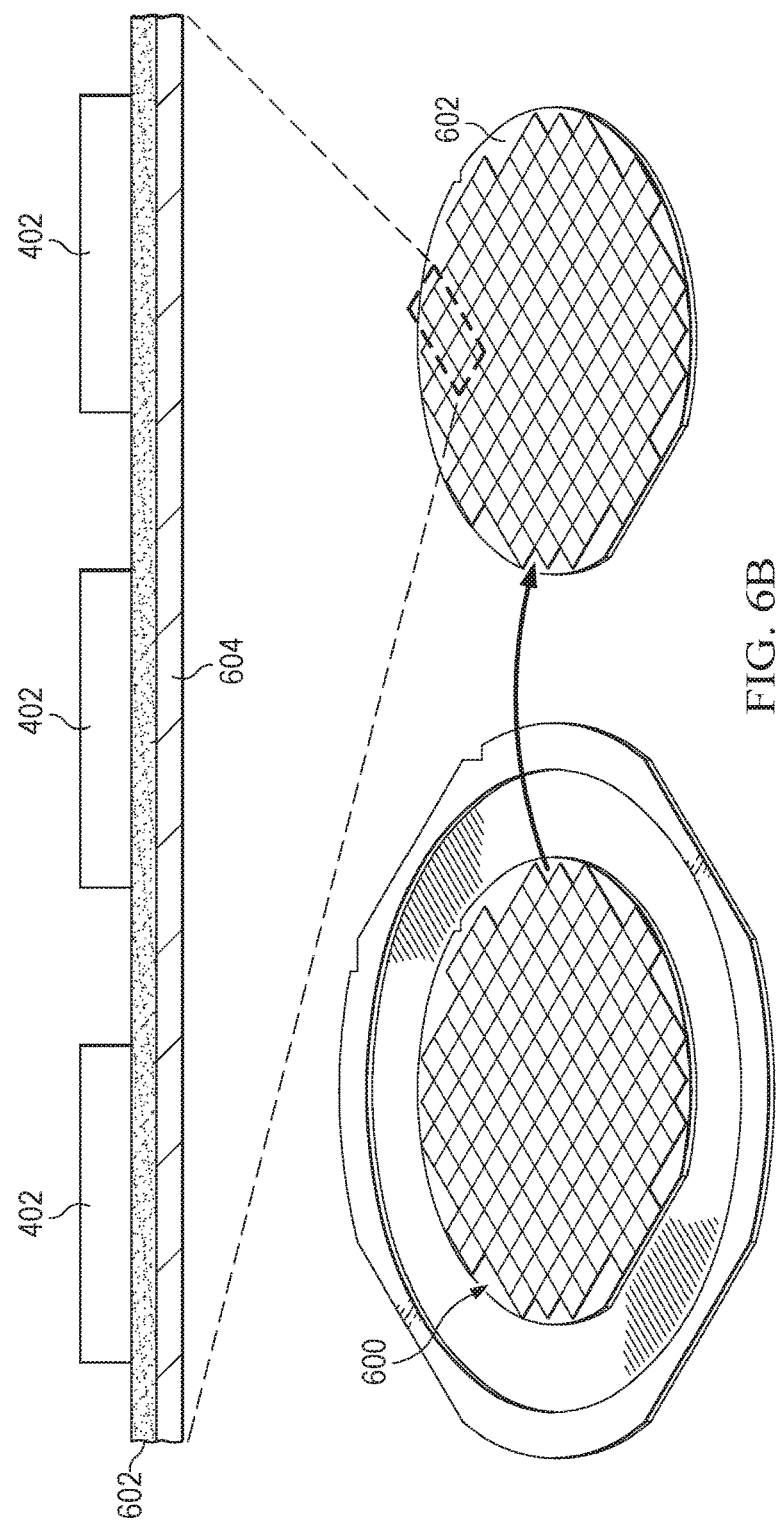

In step 501, shown in FIG. 6A, a wafer 600 is singulated into dice including a plurality of image sensors 402 and/or other camera components (e.g. SMD 404 and/or memory 420). Image sensors 402 and other camera components may be included on dice of wafer 600. An adhesive layer, such as, e.g., tape 602 may be provided. Tape 602 may be, for example, a thermal release tape, a teflon adhesive tape, an ultraviolet release tape, a laminate tape, etc. Tape 602 may be provided on a carrier 604 (shown in FIG. 6B). In examples where tape 602 is an ultraviolet release tape, carrier 604 may comprise a translucent material so that ultraviolet light may pass through carrier in order to separate the ultraviolet release tape 602 from carrier 604. In examples where tape 602 is a thermal release tape, heat may be applied to tape 602 to release tape 602 from carrier 604.

In step 502, shown in FIG. 6B, image sensors 402 and/or other camera components (such as SMDs 404 (not shown) and/or memories 420) may be transferred from singulated wafer 600 to tape 602. Although in FIG. 6B image sensor 402, SMD 404, and memory 420 appear to be of uniform height or thickness, in some cases the thickness or height of camera components such as image sensor 402, SMD 404, and memory 420 may vary vis-à-vis one another. Additionally, when transferring camera components (such as image sensor 402, SMD 404, and/or memory 420) from singulated wafer 600 to tape 602, camera components may be arranged according to a particular design. For example, gaps may be left between adjacent camera components to reduce parasitic capacitance and/or heat transfer between components. In some other examples, camera components may be arranged in close proximity, or in physical contact with one another, in order to minimize a footprint of camera assembly 400.

Figure 6C:
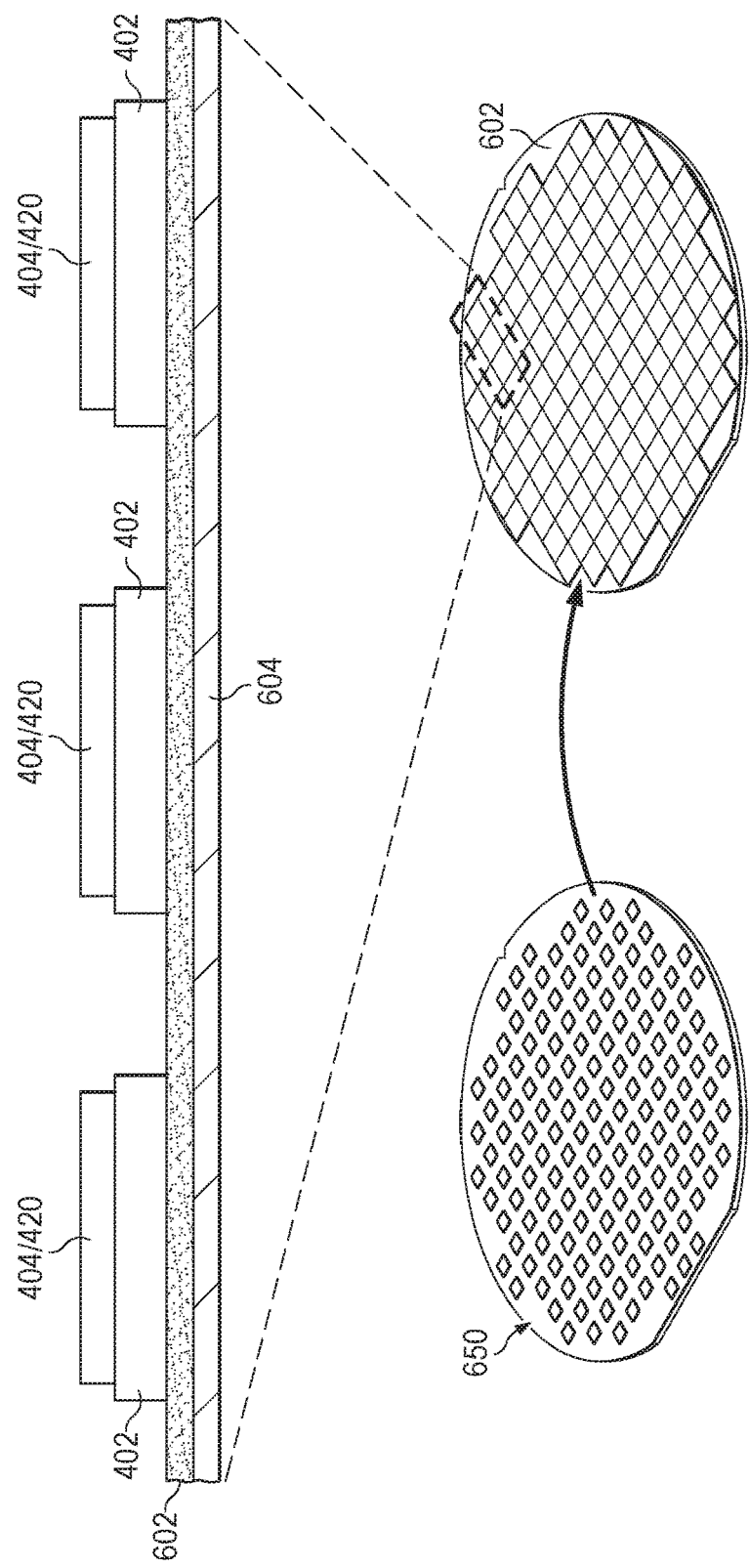

In step 503, shown in FIG. 6C, dice of wafer 650 may be die-to-die bonded to corresponding dice on tape 602 and carrier 604. Any suitable technique for die-to-die bonding may be used. For example, dice of wafer 650 may be backside-to-backside bonded to corresponding dice on tape 602 and carrier 604. In some examples, dice of wafer 650 may be bonded to corresponding dice on tape 602 using an adhesive. Dice of wafer 650 may include camera components such as, for example, one or more of image sensors 402, SMDs 404, and/or memories 420. In the example depicted in FIG. 6C, dice of wafer 650 may include SMDs 404. Dice including SMDs 404 may be die-to-die bonded to dice and/or camera components on tape 602 and carrier 604. As depicted in FIG. 6C, the die-to-die bonding technique may result in camera components arranged in a substantially vertical orientation. In the depicted example, dice on carrier tape 602 may include image sensors 402. After die-to-die bonding with wafer 650, SMDs 404 may be bonded to image sensors 402 in a substantially vertical, "stacking" orientation. Arranging camera components in such a manner may be effective to reduce and/or minimize the size of the footprint of the resultant camera assembly 400.

Although in the example shown in FIG. 6C, SMDs 404 are bonded on top of image sensors 402, different camera components (such as memories 420) and different orientations are possible and contemplated herein. For example, SMDs 404 and/or memories 420 may be coupled or otherwise disposed on tape 602 and image sensors 402 may be die-to-die bonded on top of such SMDs 404 and/or memories 420. In another example, SMDs 404 and image sensors 402 may be coupled or otherwise disposed on tape 602. Memories 420 and/or additional SMDs 404 may be die-to-die bonded on top of such SMDs 404 and image sensors 402. The preceding example orientations and camera component combinations are by way of example only. It will be understood that different combinations and orientations of camera components may be used in conjunction with the techniques described herein and according to various camera assembly designs.

Figure 6D:
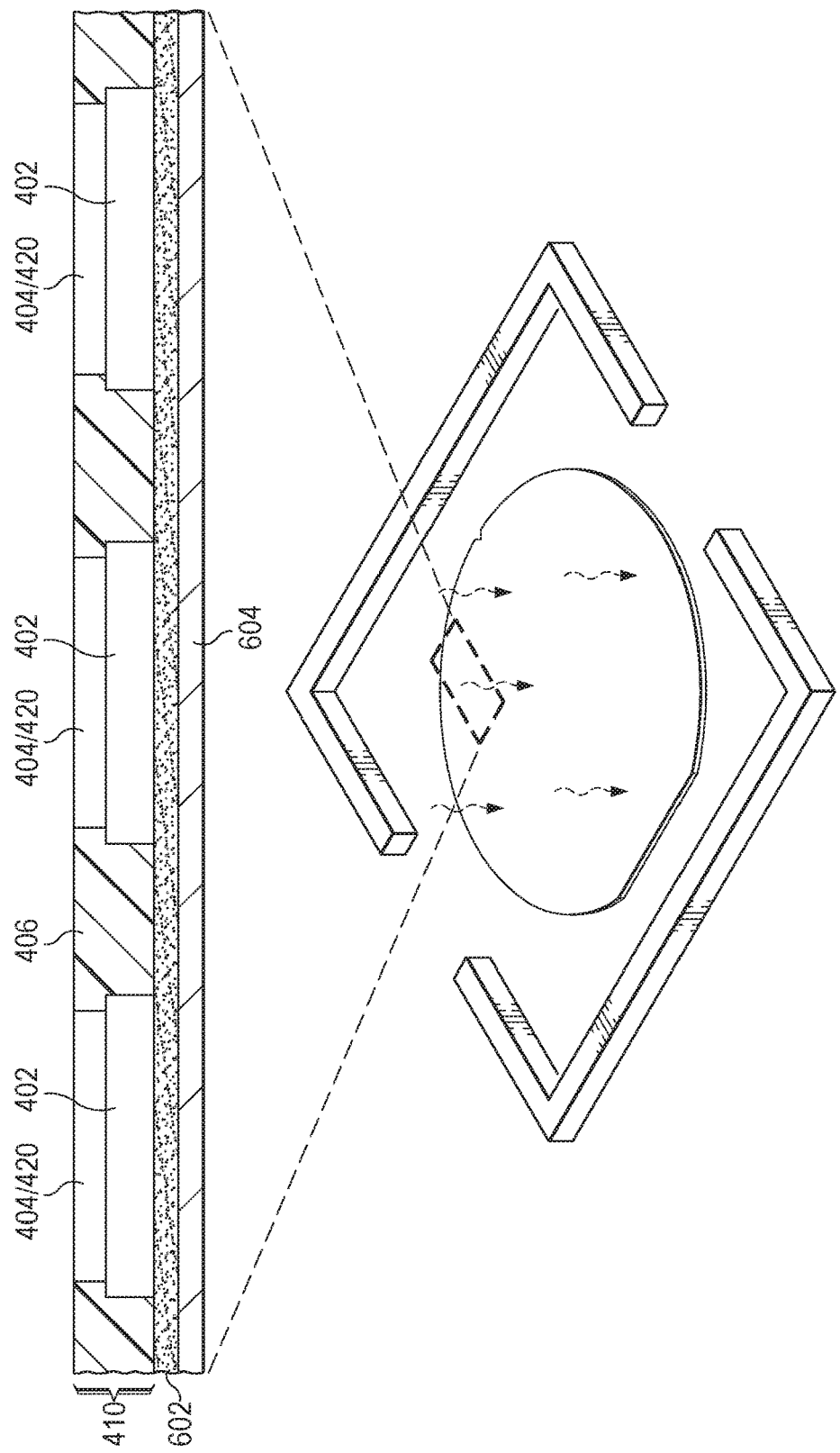

In step 504, shown in FIG. 6D, a molding compound 406 is transfer molded onto camera components such as image sensor 402, SMD 404, and/or memory 420 (not shown). Molding compound 406 may be, for example, a thermoset molding compound. Molding compound 406 may be pressurized and/or heated during the transfer molding process and may cure into a fused, insoluble polymer network. Molding compound 406 may fill spaces between and at least partially embed camera components within molding compound 406 on tape 402. Additionally, molding compound 406, once cured and solidified, may adhere to camera components and may fuse camera components into a camera component subassembly 410. In some examples, portions of camera components may be exposed on a surface of camera component subassembly 410 (e.g., bottom surface 418 depicted in FIG. 4A).

Figure 6E:
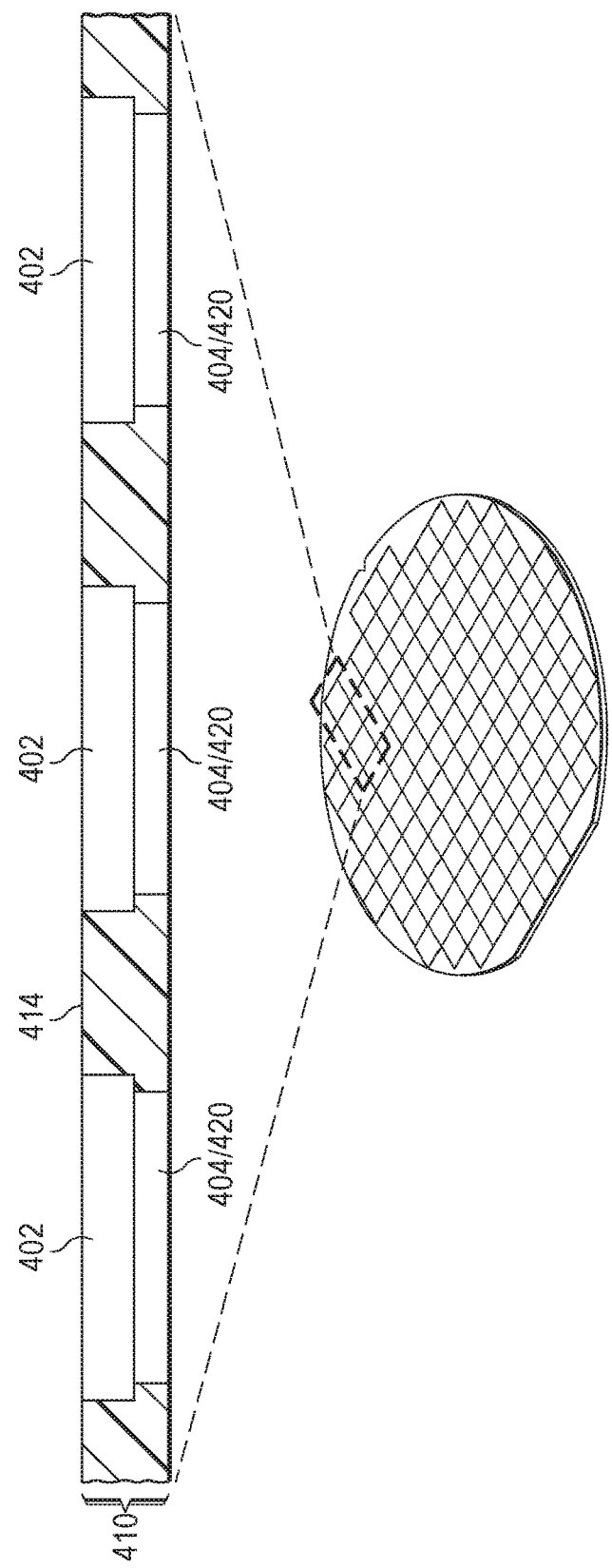

In step 505, shown in FIG. 6E, after molding compound 406 is transfer molded onto camera components such as image sensor 402, SMD 404, and memory 420, tape 602 may be removed in order to remove camera component subassembly 410 from tape 602 and carrier 604. In examples where tape 602 is thermal release tape, heat may be applied to tape 602 to release tape 602 from camera component subassembly 410. In examples where tape 602 is ultraviolet release tape, tape 602 may be exposed to ultraviolet light which may cause tape 602 to release from camera component subassembly 410. In other examples where tape 602 is adhesive tape, such as teflon tape, tape 602 may be peeled away from camera component subassembly 410. Removal of tape 602 may at least partially expose a surface of camera components that are at least partially embedded in camera component subassembly 410. For example, in FIG. 6D, surface 414 of image sensor 402 is at least partially exposed on camera component subassembly 410. Exposure of portions of the camera components may provide access to electrical contact areas of the camera components which may be electrically coupled through a redistribution layering process to other contact pads according to various designs of camera assemblies 400.

Figure 6F:
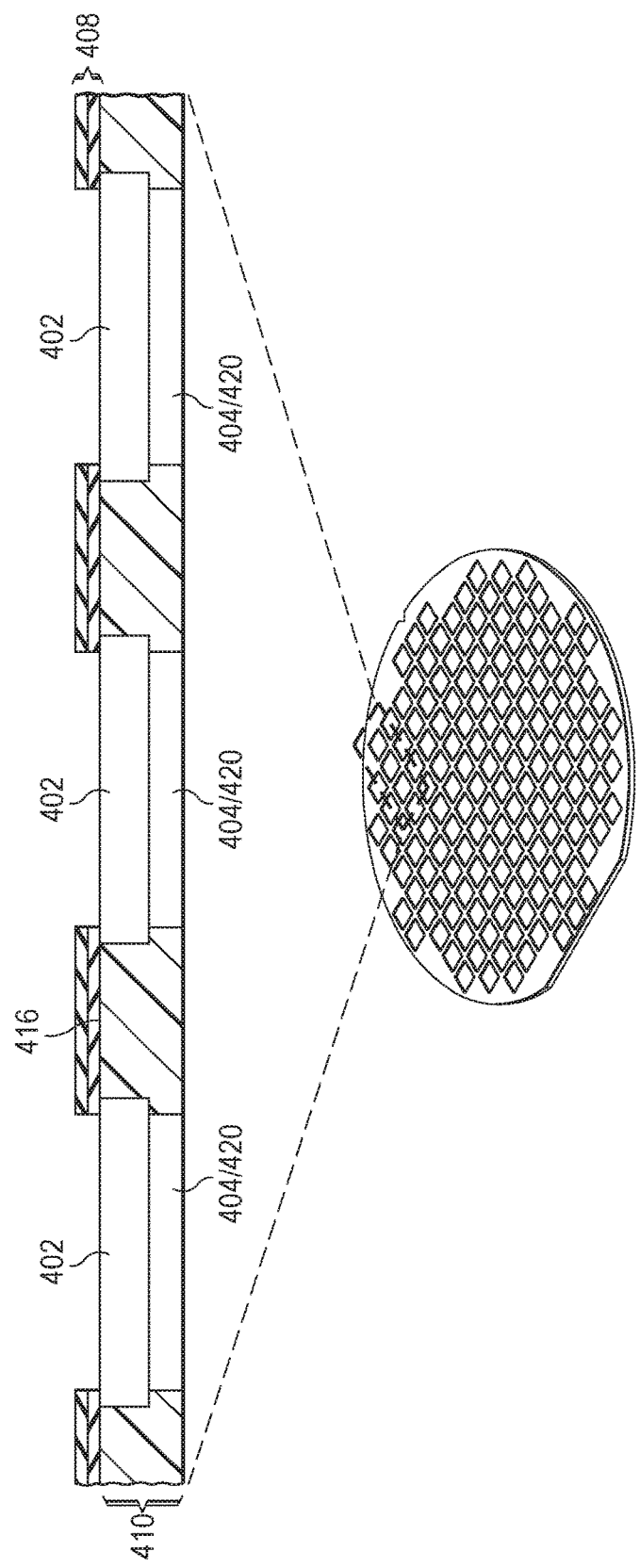

In step 506, shown in FIG. 6F, RDL 408 may be formed on camera component subassembly 410. RDL 408 may be formed on a surface of camera component subassembly 410 that includes exposed portions and/or surfaces of camera components, such as image sensor 402, SMD 404, and/or memory 420. RDL 408 may be effective to electrically couple exposed contact areas of camera components at least partially embedded in camera component subassembly 410 to other contact pads, such as, for example, contact pads 422 depicted in FIG. 4A. In at least some examples, RDL 408 may be formed through a process similar to that described above with respect to FIG. 3E.

Figure 6G:
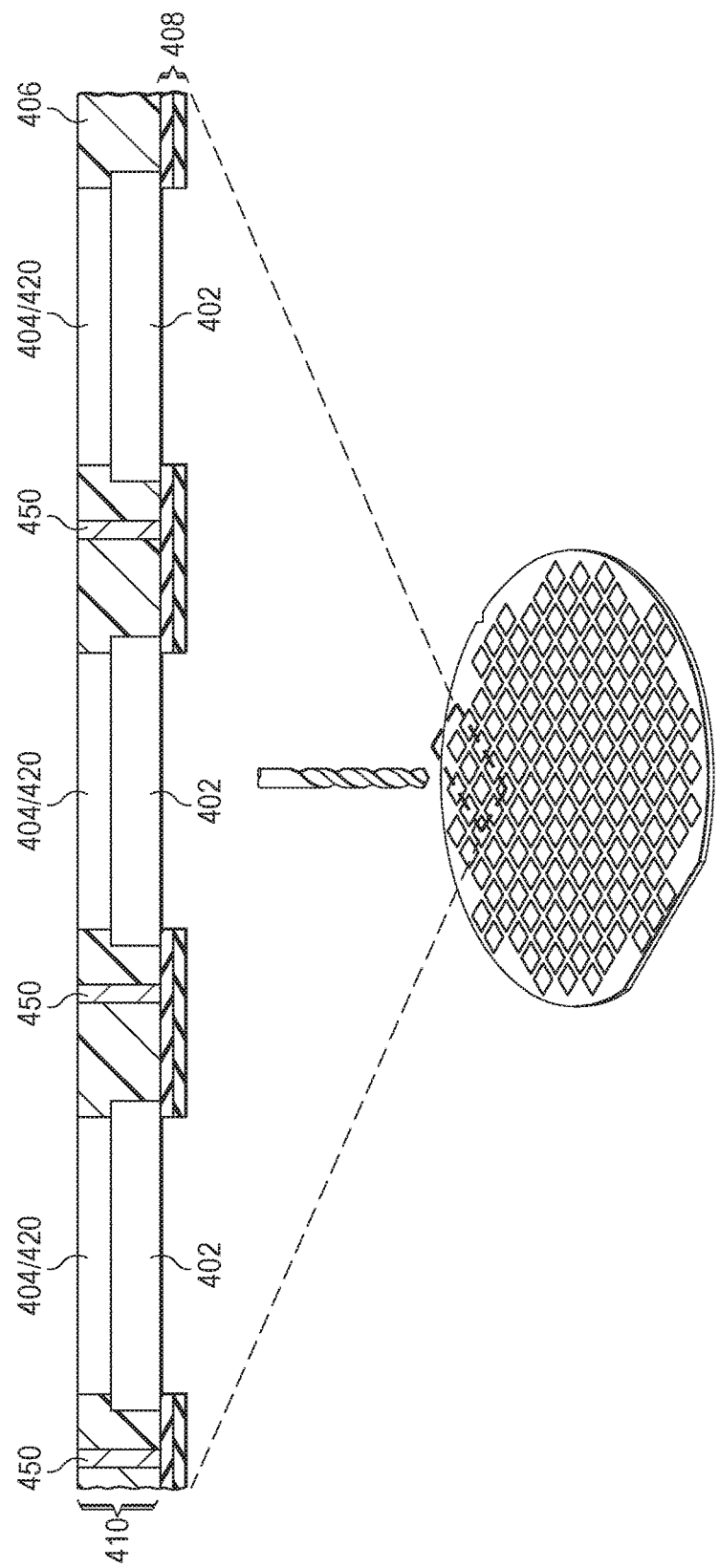

In step 507, shown in FIG. 6G, one or more vias 450 may be formed through molding compound 406 of camera component subassembly 410. In some examples, lasers may be used to form channels through molding compound 406 of camera component subassembly 410. A conductive material may be deposited in the channels formed in camera component subassembly 410 to form vias 450. For example, chromium, copper, nickel or another conductive metal may be plated within channels formed in camera component subassembly 410 to form vias 450. Vias 450 may be electrically coupled to conductive interconnect circuitry of RDL 408.

Figure 6H:
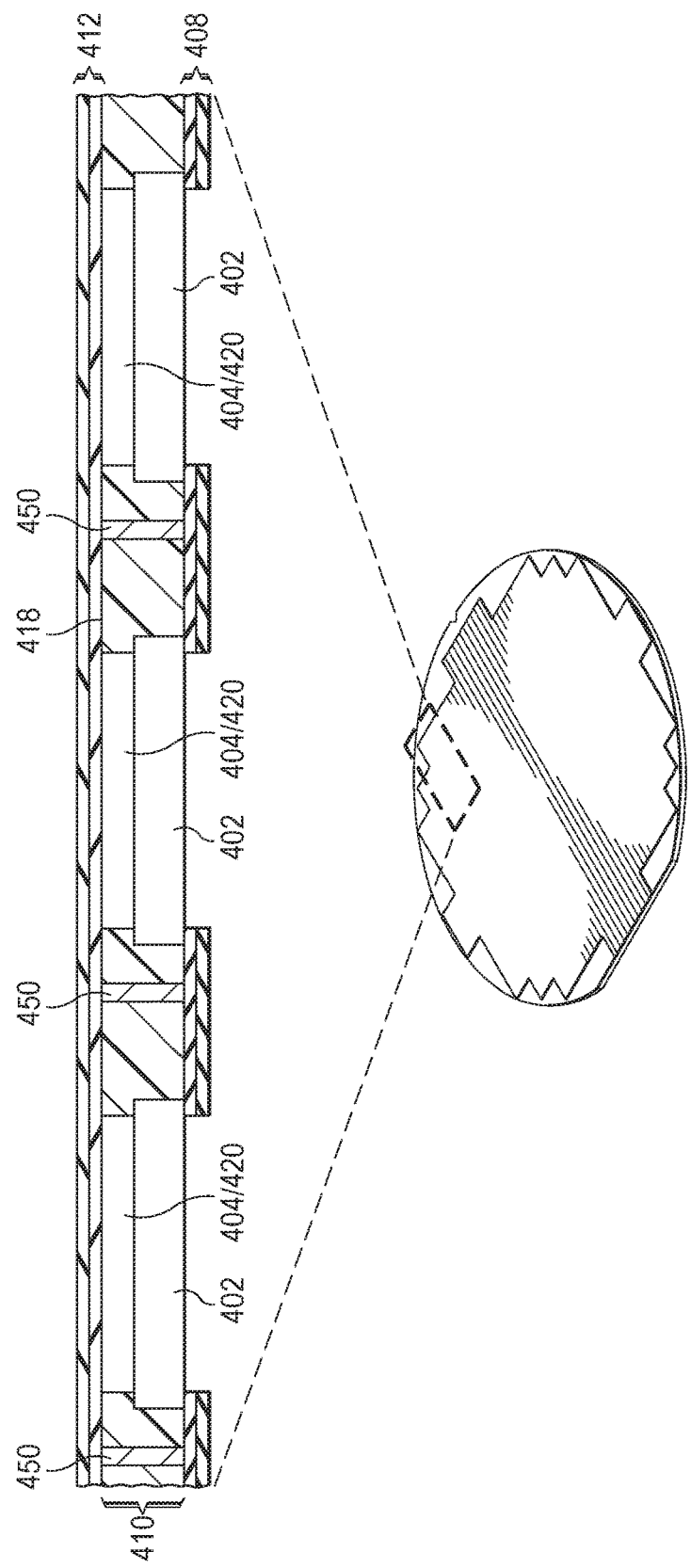

In step 508, shown in FIG. 6H, RDL 412 may be formed on surface 418 of camera component subassembly 410. RDL 412 may be formed on surface 418 of camera component subassembly 410 that includes exposed portions and/or surfaces of camera components, such as image sensor 402, SMD 404, and/or memory 420. RDL 408 may be effective to electrically couple exposed contact areas of camera components at least partially embedded in camera component subassembly 410 to other contact pads, such as, for example, contact pads 422 depicted in FIG. 4A. In at least some examples, RDL 412 may be formed through a process similar to that described above with respect to FIG. 3E. Additionally, at least one electrically conductive interconnect layer of RDL 412 may be electrically coupled to at least one electrically conductive interconnect layer of RDL 408 through one or more vias 450. Further, at least one electrically conductive interconnect layer of RDL 412 may be electrically coupled to contact areas of camera components (e.g., SMDs 404) at least partially embedded in camera component subassembly 410. Contact areas of various camera components may be at least partially exposed on surface 418. In the example depicted in FIG. 6H, contact areas of SMDs 404 may be at least partially exposed on surface 418 of camera component subassembly 410.

In step 509, shown in FIG. 6I, camera component subassembly 410, including RDLs 408, 412 may be singulated. Camera component subassembly 410 may be singulated into a plurality of dice. It should be noted that each singulated die may include all camera components (such as image sensor 402, SMDs 404, and/or memory 420, depicted in FIG. 4A) of the particular camera assembly 400 being manufactured.

Figure 6J:
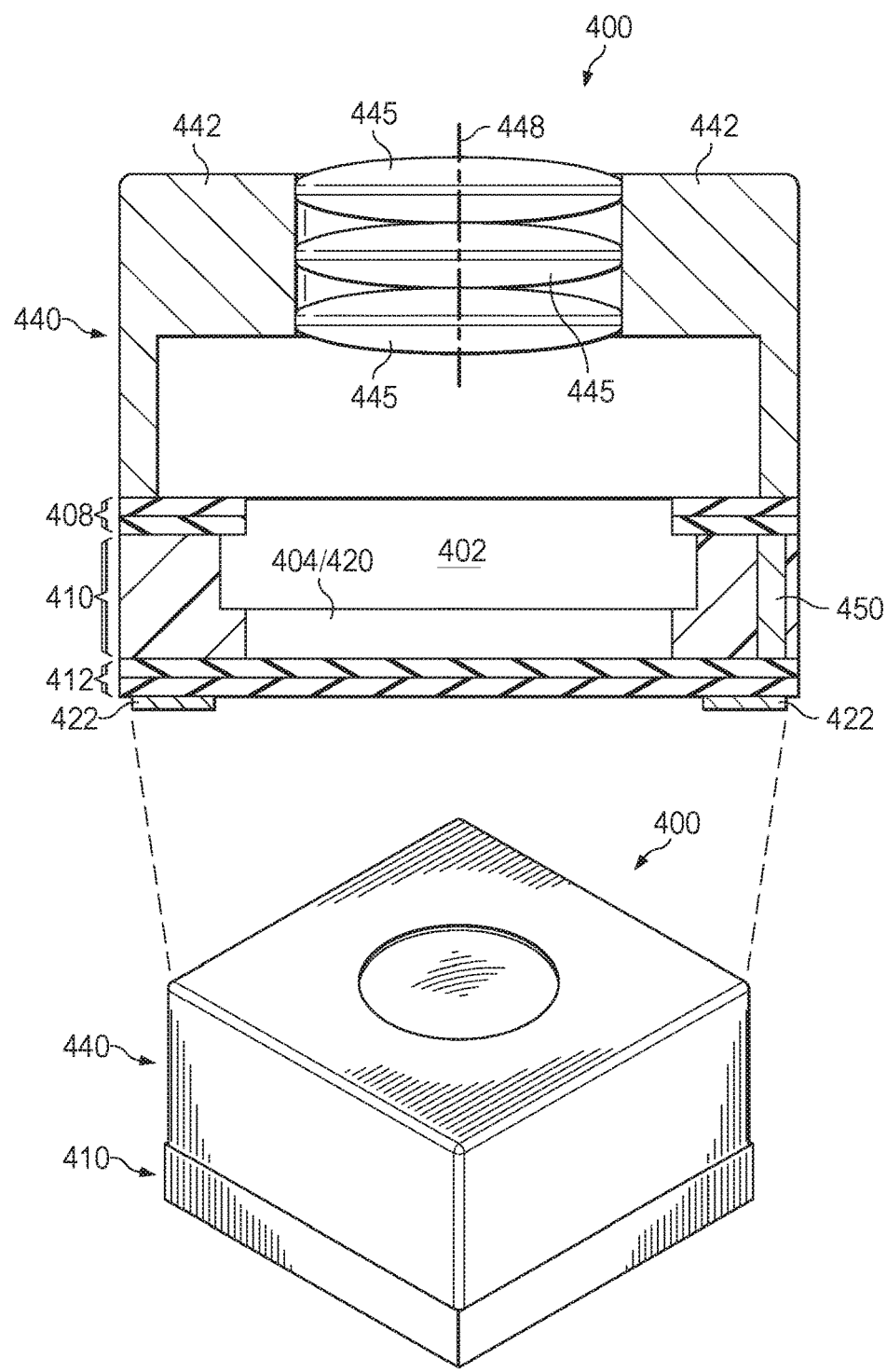

In step 510, shown in FIG. 6J, a lens module 440 may be coupled to each of the plurality of singulated dice. Lens module 440 may include one or more lenses 445, and lens housing 442. In various examples, where lens module 440 includes active electronic components, such as a VCM or MEMS actuators, lens module 440 may be electrically coupled to RDL 408. For example, lens module 440 may be electrically coupled through electrically conductive interconnect circuitry of RDL 408, vias 450, and electrically conductive interconnect circuitry of RDL 412 to a contact pad 422, or another contact pad, which may in turn be electrically coupled to a main board of a device in which camera assembly 400 is integrated, or with which camera assembly 400 is communicatively coupled. Lens module 440 may be electrically coupled to RDL 408 using solder, conductive epoxy, ball bonding, wire bonding, or other types of electrical coupling known to those skilled in the art. In examples where lens module 440 is of fixed focus and includes no electronic components, lens module 440 may be coupled to RDL 408 or camera component subassembly 410 without requiring any electrical coupling. For example, a fixed-focus lens module 440 may be coupled to RDL 408 or to camera component subassembly 410 using an epoxy adhesive. Lens module 440 may be coupled to RDL 408 in a position such that lens module 440 overlies an optical sensor of image sensor 402 along optical axis 448.

In various examples, image sensor 402 may be about 0.2 to about 0.3 mm in height or thickness. Memory 420 may be about 0.2 to about 0.3 mm in height. Accordingly, camera component subassembly 410 may have a thickness of about 0.4 to about 0.6 mm. RDLs 408, 412 may have a thickness of less than about 0.1 mm. Accordingly, in the examples depicted in FIG. 6J, camera component subassembly 410 together with RDLs 408, 412 may have a thickness of about 0.4 to about 0.8 mm. The thickness of lens module 440 may vary according to different commercially available designs of lens modules.

The above-described embodiments may achieve a number of advantages over conventional camera module designs. The overall size of the camera module may be reduced. Using RDL layers in place of conventional printed circuit board circuitry may allow for increased density of camera components and interconnect circuitry. Use of transfer molding to three-dimensionally embed, or partially embed camera components may also increase density of components within a camera assembly, further reducing size of camera assembly modules. Further, use of the manufacturing processes described above for creating camera assemblies may eliminate the need for packaging substrates, printed circuit boards (PCBs), gold wire bonding, C4 bumps, and most chip soldering. RDLs may be effective to electrically couple all or most all of the camera components within a camera assembly module formed in accordance with the processes described above. Elimination of PCBs and other materials as described above may not only reduce the size of camera assembly modules, but may significantly reduce manufacturing costs by eliminating the need for various components.

Density of camera components and 3D-embedding of camera components, as described herein, may also allow for reduction of parasitic capacitance and provide for higher frequency response relative to traditional camera modules. Additionally, embedding or partially embedding camera components within a camera assembly as described herein may allow for many components which were previously disposed on a mother board to be moved into the camera assembly, thereby freeing up valuable space on the mother board. Using a transfer mold to at least partially embed camera components into a 3D structure and electrically coupling camera components using redistribution layer techniques may allow for camera assemblies which do not need rigid flex substrates, PCBs, and/or wire or ball bonding.

Figure 7:
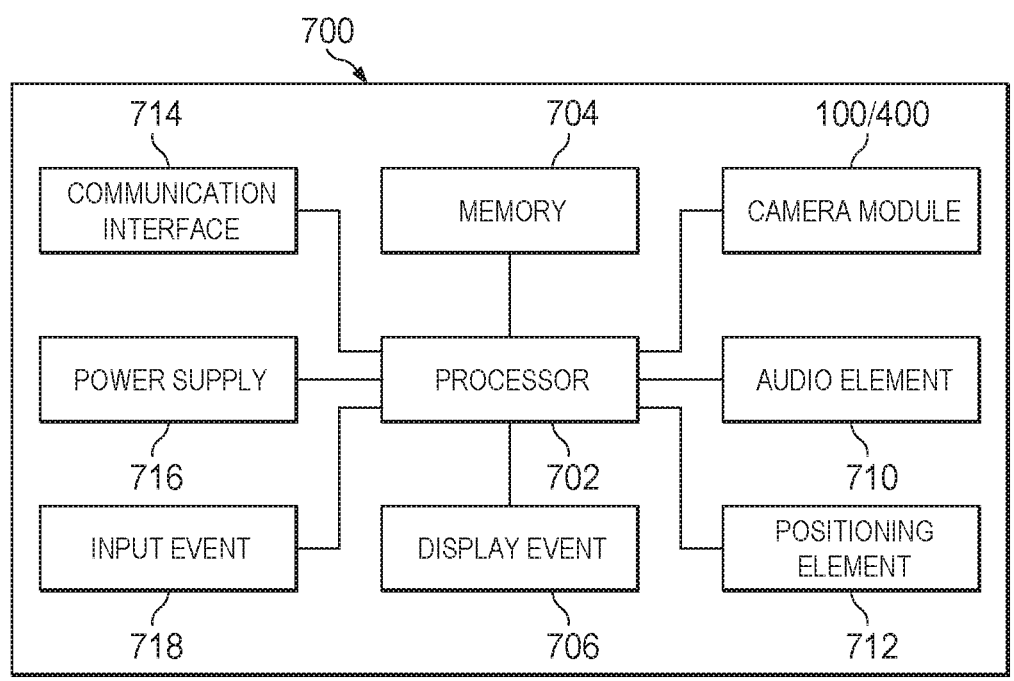
FIG. 7 is an example block diagram illustrating basic components of a computing device, in accordance with the present invention.

FIG. 7 is an example block diagram illustrating basic components of a computing device, such as computing device 700. In this example, the device 700 includes at least one processor 702 for executing instructions that can be stored in at least one memory device 704. As would be apparent to one of ordinary skill in the art, the memory device 704 can include one or more different types of memory, data storage or computer-readable storage media, such as, for example, a first data storage for program instructions for execution by the processor 702, a second data storage for images or data and/or a removable storage for transferring data to other devices.

The computing device 700 includes one or more camera assemblies 100 and/or 400 configured to capture an image of people or objects in the vicinity of the device 700. The computing device 700 may include a main board, which may be the primary circuit board for the computing device 700 onto which one or more of the following components may be mounted. The camera module 100 or 400 may include a contact pads 122, 422 which may be electrically coupled to the main board of the computing device 700 in a variety of ways, such as by direct mounting to the main board or with an interposer, which serves as an intermediate coupling device providing an electrical interface between redistribution layers 108, 408 and the main board. The interposer may comprise, for example, a cable or a rigid or flexible circuit board having interfaces coupled to the contact pads 122, 422 and the main board. For example, anisotropic conductive film may be used to electrically couple contact pads 122 and/or contact pads 422 to a flexible printed circuit or cable. The flexible printed circuit or cable may, in turn, be electrically coupled to a main board using, for example, a zero insertion force connector or anisotropic conductive film.

The computing device 700 includes a display element 706 for displaying images using technologies such as, for example, electronic ink (e-ink), organic light emitting diode (OLED) or liquid crystal display (LCD). The computing device 700 may also include an audio element 710, such as one or more audio speakers 711 and/or audio capture elements capable of capturing audio data, such as microphones 713. The computing device 700 may also include a positioning element 712, such as motion, position or orientation determining element 715, that provides information such as a position, direction, motion, or orientation of the device 700. The computing device 700 can include one or more input elements 718 operable to receive inputs from a user. The input elements 718 can include, for example, a push button, touch pad, touch screen, wheel, joystick, keyboard, mouse, trackball, keypad or any other such device or element whereby a user can provide inputs to the computing device 700. The computing device 700 may also include at least one communication interface 714, comprising one or more wireless components operable to communicate with one or more separate devices within a communication range of the particular wireless protocol. The wireless protocol can be any appropriate protocol used to enable devices to communicate wirelessly, such as Bluetooth, cellular, or IEEE 802.11. It should be understood that the computing device 700 may also include one or more wired communications interfaces for coupling and communicating with other devices. The computing device 700 may also include a power supply 716, such as, for example, a rechargeable battery operable to be recharged through conventional plug-in approaches, or through other such approaches as capacitive charging.

Although the flowcharts and methods described herein may describe a specific order of execution, it is understood that the order of execution may differ from that which is described. For example, the order of execution of two or more blocks or steps may be scrambled relative to the order described. Also, two or more blocks or steps may be executed concurrently or with partial concurrence. Further, in some embodiments, one or more of the blocks or steps may be skipped or omitted. It is understood that all such variations are within the scope of the present disclosure.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. The various features and processes described above may be used independently of one another, or may be combined in various ways. All possible combinations and subcombinations are intended to fall within the scope of this disclosure.

In addition, conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Although this disclosure has been described in terms of certain example embodiments and applications, other embodiments and applications that are apparent to those of ordinary skill in the art, including embodiments and applications that do not provide all of the benefits described herein, are also within the scope of this disclosure. The scope of the inventions is defined only by the claims, which are intended to be construed without reference to any definitions that may be explicitly or implicitly included in any incorporated-by-reference materials.

What is claimed is:

1. A method of forming a camera assembly, the method comprising:
   coupling an image sensor and a plurality of camera components to a first side of a thermal release tape layer, wherein a second side of the thermal release tape layer is coupled to a carrier;
   coupling a first circuit component to a back side of the image sensor, wherein the first circuit component comprises a surface mount device or a memory;
   transfer molding a thermoset compound onto the image sensor, the plurality of camera components, and at least a portion of the first side of the thermal release tape layer to form a camera component subassembly, wherein the thermoset compound couples the image sensor and to the plurality of camera components;
   applying heat to the thermal release tape layer;
   separating the thermal release tape layer from the camera component subassembly;
   depositing a first dielectric layer and a first interconnect layer on a first surface of the camera component subassembly to form a first redistribution layer that is electrically coupled to the image sensor;
   depositing a second dielectric layer and a second interconnect layer on a second surface of the camera component subassembly to form a second redistribution layer on the first circuit component;
   coupling a plurality of contact pads to the second redistribution layer, wherein at least one of the plurality of contact pads is electrically coupled to the first circuit component via the second interconnect layer; and
   coupling a lens module to the first redistribution layer to form a first camera assembly.

2. A method of forming a camera assembly, comprising:
   coupling a first side of a camera component to a back side of an image sensor;
   transfer molding a compound onto the image sensor and the camera component to form a camera component subassembly;
   depositing a first dielectric layer and a first interconnect layer on a first surface of the camera component subassembly to form a first redistribution layer that is electrically coupled to the camera component;
   depositing a second dielectric layer and a second interconnect layer on a second surface of the camera component subassembly to form a second redistribution layer, wherein the second surface is opposite the first surface, wherein the image sensor and the camera component are disposed between the first redistribution layer and the second redistribution layer, and wherein the second redistribution layer is formed on at least a portion of a front side of the image sensor opposite the back side of the image sensor and is electrically coupled to the image sensor;

coupling a contact pad to the first redistribution layer, wherein the contact pad is electrically coupled to the image sensor via the first interconnect layer; and coupling a lens module to the second redistribution layer to form the camera assembly.

3. The method of claim 2, further comprising:
coupling the image sensor and the camera component to a carrier using an adhesive layer.

4. The method of claim 2, further comprising:
coupling the image sensor and the camera component to a carrier using an ultraviolet release tape;
exposing the ultraviolet release tape to ultraviolet light; and
separating the ultraviolet release tape from the camera component subassembly.

5. The method of claim 2, further comprising:
forming a channel through the compound from the second surface of the camera component subassembly to the first surface of the camera component subassembly; and
depositing an electrically conductive material within the channel to electrically couple the first redistribution layer to the second redistribution layer.

6. The method of claim 2, further comprising forming the first redistribution layer on the first surface of the camera component subassembly with a thickness of less than about 0.1 mm.

7. A camera assembly, comprising:
a camera component subassembly comprising:
an image sensor;
a camera component; and
a molding compound disposed on the image sensor and the camera component, wherein a first side of the camera component is coupled to a back side of the image sensor;
a first redistribution layer formed on a first surface of the camera component subassembly, the first redistribution layer comprising a first dielectric layer and a first interconnect layer, the first redistribution layer coupled to the image sensor;
a second redistribution layer formed on a second surface of the camera component subassembly, wherein the second surface is opposite the first surface, the second redistribution layer comprising a second interconnect layer, wherein the image sensor and the camera component are disposed between the first redistribution layer and the second redistribution layer, and wherein the second redistribution layer is formed on at least a portion of a second side of the camera component opposite the first side of the camera component and is electrically coupled to the camera component; and
a lens module coupled to the first redistribution layer and aligned with the image sensor along an optical axis.

8. The camera assembly of claim 7, further comprising:
a via extending from the first surface to the second surface, wherein the via electrically couples the first redistribution layer and the second redistribution layer.

9. The camera assembly of claim 7, further comprising:
a first contact pad formed on the second redistribution layer, wherein the first contact pad is electrically coupled to the camera component via the second interconnect layer; and a second contact pad formed on the second redistribution layer, wherein the second contact pad is electrically coupled to the image sensor via the first interconnect layer.

10. The camera assembly of claim 7, further comprising a plurality of contact pads formed on the second redistribution layer, wherein at least one of the plurality of contact pads is electrically coupled to the image sensor by the second interconnect layer of the second redistribution layer.

11. The camera assembly of claim 7, wherein the camera component subassembly together with the first redistribution layer has a thickness of less than about 0.5 mm.

12. The camera assembly of claim 7, wherein the first redistribution layer has a thickness of less than about 0.1 mm.

13. The camera assembly of claim 7, wherein the molding compound at least partially embeds the image sensor and the camera component in the camera component subassembly.

14. The camera assembly of claim 7, wherein:
the lens module includes an actuator effective to translate a lens along the optical axis; and
the lens module is electrically coupled to a contact pad of the first redistribution layer.

15. A camera assembly, comprising:
a camera component subassembly comprising:
an image sensor;
a camera component; and
a molding compound disposed on the image sensor and the camera component;
a first redistribution layer having a first side and a second side opposite the first side, the second side of the first redistribution layer being coupled to a first surface of the camera component subassembly, the first redistribution layer comprising a first dielectric layer and a first interconnect layer, wherein the first dielectric layer of the first redistribution layer directly contacts the image sensor and the camera component;
a lens module disposed on the first side of the first redistribution layer opposite the camera component subassembly, wherein the lens module is aligned with the image sensor along an optical axis passing through the first redistribution layer; and
a plurality of contact pads arranged on the first side of the first redistribution layer, wherein at least one of the plurality of contact pads is electrically coupled to the image sensor via the first interconnect layer.

16. The camera assembly of claim 15, wherein the molding compound is disposed in a space between the image sensor and the camera component to fuse the image sensor to the camera component.

17. The camera assembly of claim 15, wherein the first interconnect layer comprises conductive interconnects electrically coupling the image sensor, the camera component, and the lens module to corresponding ones of the plurality of contact pads.

18. The camera assembly of claim 15, wherein the camera component subassembly together with the first redistribution layer has a thickness of less than about 0.5 mm.

19. The camera assembly of claim 15, wherein the first redistribution layer has a thickness of less than about 0.1 mm.

20. The camera assembly of claim 15, wherein the molding compound at least partially embeds the image sensor and the camera component in the camera component subassembly.

21. The camera assembly of claim 15, wherein the lens module is attached to the first side of the first redistribution layer.

22. The camera assembly of claim 15, wherein the second side of the first redistribution layer is substantially planar.

23. The camera assembly of claim 15, wherein a first surface of the image sensor and a first surface of the camera component are exposed on the first surface of the camera component subassembly.

\* \* \* \* \*